(12) United States Patent
Sasadaira et al.

(10) Patent No.: US 11,092,620 B2
(45) Date of Patent: Aug. 17, 2021

(54) CONDUCTION INSPECTION DEVICE MEMBER AND CONDUCTION INSPECTION DEVICE

(71) Applicant: SEKISUI CHEMICAL CO., LTD., Osaka (JP)

(72) Inventors: Masao Sasadaira, Shiga (JP); Xiaoge Wang, Shiga (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 103 days.

(21) Appl. No.: 16/323,801

(22) PCT Filed: Aug. 8, 2017

(86) PCT No.: PCT/JP2017/028842
§ 371 (c)(1),
(2) Date: Feb. 7, 2019

(87) PCT Pub. No.: WO2018/030438
PCT Pub. Date: Feb. 15, 2018

(65) Prior Publication Data
US 2019/0212365 A1    Jul. 11, 2019

(30) Foreign Application Priority Data
Aug. 8, 2016 (JP) .............................. JP2016-155718

(51) Int. Cl.
*G01R 1/067* (2006.01)
*G01R 31/00* (2006.01)
(Continued)

(52) U.S. Cl.
CPC ........... *G01R 1/07307* (2013.01); *G01R 1/06* (2013.01); *G01R 1/073* (2013.01); *G01R 31/26* (2013.01); *G01R 31/28* (2013.01)

(58) Field of Classification Search
CPC .. G01R 1/06; G01R 1/06733; G01R 1/06755; G01R 1/073; G01R 1/0735;
(Continued)

(56) References Cited

U.S. PATENT DOCUMENTS

| 6,545,363 B2 * | 4/2003 | Maruyama | ......... G01R 1/06711 257/773 |
| 6,720,787 B2 * | 4/2004 | Kimura | .............. H01R 13/2414 29/884 |

(Continued)

FOREIGN PATENT DOCUMENTS

| JP | 2004-152554 | 5/2004 |
| JP | 2004-309465 | 11/2004 |

(Continued)

OTHER PUBLICATIONS

International Search Report dated Nov. 7, 2017 in International (PCT) Application No. PCT/JP2017/028842.

*Primary Examiner* — Minh N Tang
(74) *Attorney, Agent, or Firm* — Wenderoth, Lind & Ponack, L.L.P.

(57) ABSTRACT

Provided is a conduction inspection device member, wherein cracks and voids are less likely to form in conductive parts, conduction performance is less likely to be impaired even when a conduction test is repeated, and contact marks are less likely to remain in the portion of the member in contact with a member to be tested. Also provided is a conduction inspection device comprising the conduction inspection device member. The conduction inspection device member comprises a substrate 13, through holes 11, and conductive parts 12. The multiple through holes 11 are arranged in the substrate 13, the conductive parts 12 are housed inside the through holes 11, and the conductive parts 12 contain conductive particles 2. The conductive particles 2 each comprise a substrate particle 21 and a conductive layer 22 on (Continued)

the surface of the substrate particle 21. The conductive layer 22 has multiple protrusions 23 on the outer surface thereof.

<p align="center"><b>10 Claims, 4 Drawing Sheets</b></p>

(51) Int. Cl.
*H05K 1/09* (2006.01)
*G01R 1/073* (2006.01)
*G01R 31/28* (2006.01)
*G01R 1/06* (2006.01)
*G01R 31/26* (2020.01)

(58) Field of Classification Search
CPC ........... G01R 1/07307; G01R 1/07357; G01R 31/26; G01R 31/28; H01R 12/52; H01R 12/714; H01R 12/7082; H01R 13/24; H01R 13/2407; H01R 13/2414
See application file for complete search history.

(56) References Cited

U.S. PATENT DOCUMENTS

| | | | |
|---|---|---|---|
| 7,384,279 B2 * | 6/2008 | Igarashi | G01R 1/0735 439/66 |
| 7,628,616 B2 | 12/2009 | Yoshida et al. | |
| 8,076,952 B2 | 12/2011 | Yoshida | |
| 8,395,052 B2 * | 3/2013 | Ishimatsu | H05K 3/323 174/257 |
| 10,177,465 B2 * | 1/2019 | Hirayama | C23C 18/208 |
| 2001/0016435 A1 * | 8/2001 | Fujimura | H01R 12/7076 439/66 |
| 2004/0259406 A1 | 12/2004 | Yoshida et al. | |
| 2005/0146414 A1 | 7/2005 | Yoshida et al. | |
| 2006/0211280 A1 | 9/2006 | Igarashi et al. | |
| 2009/0159325 A1 * | 6/2009 | Yamada | H01R 13/2414 174/262 |
| 2009/0230983 A1 | 9/2009 | Yoshida | |
| 2012/0152593 A1 * | 6/2012 | Nakaone | H01L 23/49894 174/250 |
| 2013/0285692 A1 | 10/2013 | Lee | |
| 2015/0293147 A1 | 10/2015 | Lee | |

FOREIGN PATENT DOCUMENTS

| | | |
|---|---|---|
| JP | 2006-228743 | 8/2006 |
| JP | 2007-87709 | 4/2007 |
| JP | 2008-34173 | 2/2008 |
| JP | 2008-164501 | 7/2008 |
| JP | 2009-139298 | 6/2009 |
| JP | 2012-28471 | 2/2012 |
| JP | 2015-501427 | 1/2015 |

* cited by examiner

Fig. 8 - Prior Art
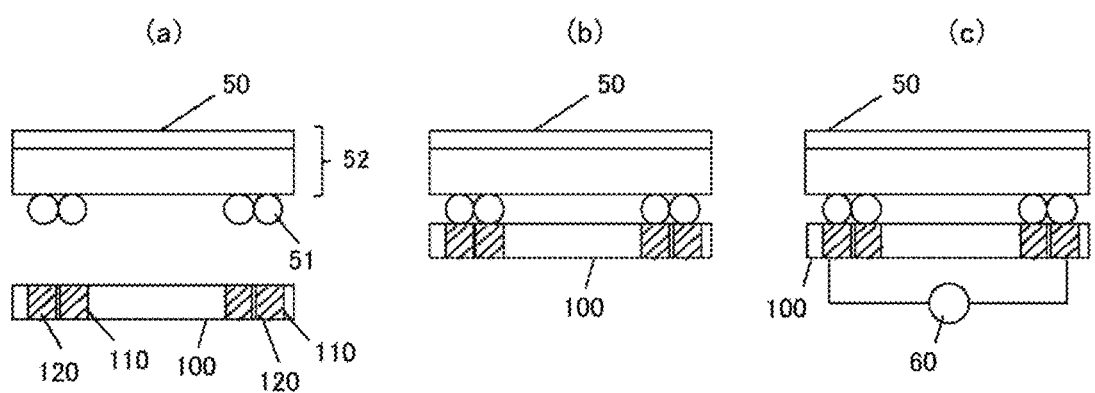

CONDUCTION INSPECTION DEVICE MEMBER AND CONDUCTION INSPECTION DEVICE

TECHNICAL FIELD

The present invention relates to a conduction inspection device member, such as a BGA substrate, and a conduction inspection device.

BACKGROUND ART

Along with development of advanced techniques in micronization and integration of electronic circuit devices, such as semiconductor integrated circuits, more advanced fine-pitch technology has also been required for inspection devices for testing the various electrical characteristics of electronic circuit devices. In recent years, use of probe cards etc. for conduction tests of electronic circuit devices, for example, has been known. The probe card is a member in which many test probes are accumulated and bundled, and is known as an test member for extracting electrical signals of electrode pads by bringing a contact probe into contact with the electrode pads of a semiconductor integrated circuit. The electrical signals entering from the contact probe are guided to external terminals disposed at predetermined intervals on a multilayer wiring substrate through wiring of the multilayer wiring substrate.

FIG. 8 schematically shows a state of testing the electric characteristics of an electronic circuit device by using a conduction inspection device member. In FIG. 8, a BGA substrate 50 (ball grid array substrate) is used as the electronic circuit device. The BGA substrate 50 has a structure in which connection pads are arranged in a lattice shape on a multilayer substrate 52, and a solder ball 51 is disposed in each pad. The conduction inspection device member in FIG. 8 is a probe card 100. In the probe card 100, multiple through holes 110 are formed in a substrate, and the through holes 110 are each filled with a conductive material 120. The BGA substrate 50 and the probe card 100 are prepared, as shown in FIG. 8 (a), and the BGA substrate 50 is brought into contact with the probe card 100 and compressed, as shown in FIG. 8 (b). At this time, the solder balls 51 are in contact with the conductive material 120 in the through holes 110. In this state, an ammeter 60 is connected, as shown in FIG. 8 (c), and a conduction test is carried out to determine whether the BGA substrate 50 passes or fails.

Various proposals have been made for probe cards. There are proposals for probe card members that are less likely to have a loose connection, and for members that can be suitably used for electronic circuit devices, such as BGA substrates (see, for example, PTL 1 to PTL 3). Moreover, conventional probes have a hard, sharp tip, and easily damage electrodes. In order to prevent such problems, there are proposals for probe cards for conduction tests comprising, as a probe, conductive particles with controlled compressive elasticity modulus (see, for example, PTL 4 to PTL 5).

CITATION LIST

Patent Literature

PTL 1: JP2004-152554A
PTL 2: JP2006-228743A
PTL 3: JP2008-34173A
PTL 4: JP2008-164501A
PTL 5: JP2012-28471A

SUMMARY OF INVENTION

Technical Problem

However, when the conduction inspection device member is brought into compression contact with an electronic circuit device, such as a BGA substrate, cracks are formed in the conductive material filled in the through holes of the probe card due to compressive stress. This caused a problem that the conductivity of the conductive material was impaired, thereby resulting in failure to perform a conduction test using the probe card. Moreover, because compression by a conduction test was repeatedly performed, spaces, such as voids, were gradually formed in the conductive material. This also caused a problem that the conductivity of the conductive material was impaired, thereby resulting in failure to perform a normal conduction test using the probe card.

The present invention was made in consideration of the above problems. An object of the present invention is to provide a conduction inspection device member, wherein cracks and voids are less likely to form in conductive parts, conduction performance is less likely to be impaired even when a conduction test is repeated, and contact marks are less likely to remain in the portion of the member in contact with a member to be tested. Another object of the present invention is to provide a conduction inspection device comprising the conduction inspection device member.

Solution to Problem

The present inventors conducted extensive research to achieve the above objects, and consequently found that the above objects can be achieved by using conductive particles having a specific structure as a material for forming conductive parts. Thus, the present invention has been completed.

Specifically, the present invention includes, for example, the main subjects described in the following items.

Item 1. A conduction inspection device member comprising a substrate, through holes, and conductive parts;
the multiple through holes being arranged in the substrate,
the conductive parts being housed inside the through holes,
the conductive parts containing conductive particles,
the conductive particles each comprising a substrate particle and a conductive layer on the surface of the substrate particle, and
the conductive layer having multiple protrusions on the outer surface thereof.

Item 2. The conduction inspection device member according to Item 1, wherein the conductive particles contained in the conductive parts further comprise conductive particles having no multiple protrusions on the outer surface of the conductive layer.

Item 3. The conduction inspection device member according to Item 1 or 2, wherein the conductive layer comprises at least one member selected from the group consisting of copper, nickel, palladium, ruthenium, rhodium, silver, gold, platinum, iridium, cobalt, iron, tungsten, molybdenum, tin, germanium, indium, tellurium, thallium, bismuth, arsenic, selenium, phosphorus, boron, graphite, alumina, titanium oxide, tungsten carbide, and silicon carbide.

Item 4. Conductive particles used for the inspection device member according to any one of Items 1 to 3.

Item 5. A conduction inspection device comprising the conduction inspection device member according to any one of Items 1 to 3.

Advantageous Effects of Invention

According to the conduction inspection device member of the present invention, cracks and voids are less likely to form in the conductive parts, conduction performance is less likely to be impaired even when a conduction test is repeated, and contact marks are less likely to remain in the portion of the member in contact with a member to be tested. Therefore, the conduction inspection device member is suitable as a member for providing a conduction inspection device having excellent accuracy and durability.

BRIEF DESCRIPTION OF DRAWINGS

FIG. 8 shows prior art, and schematically shows the state of testing the electric characteristics of an electronic circuit device using a conduction inspection device member.

DESCRIPTION OF EMBODIMENTS

Embodiments of the present invention are described in detail below. In the present specification, the terms "contain" and "comprise" include the concepts of "contain," "comprise," "substantially consist of," and "consist of."

Figure 1:
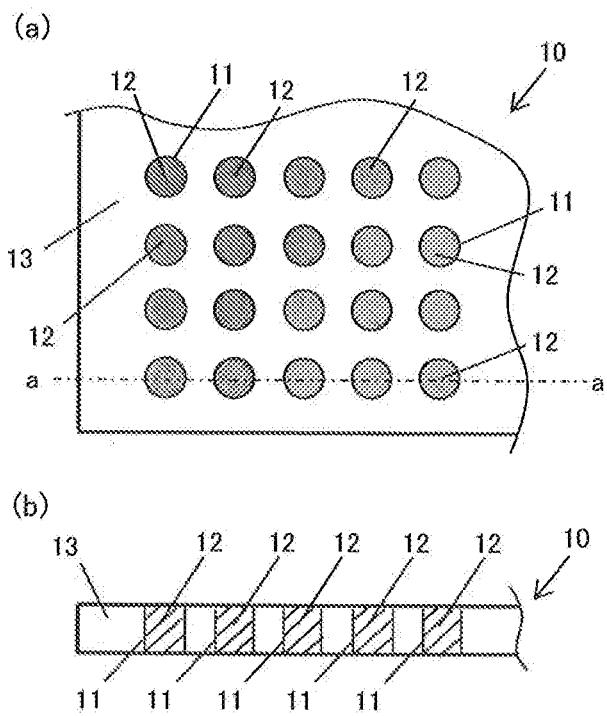
FIG. 1 shows an example of an embodiment of the conduction inspection device member according to the present invention. (a) is a partial plan view, and (b) is an a-a line cross-sectional view in the plan view (a).

FIG. 1 shows an example of an embodiment of the conduction inspection device member according to the present invention. (a) is a plan view, and (b) is an a-a line cross-sectional view in the plan view (a).

The conduction inspection device member 10 of the present embodiment comprises a substrate 13, through holes 11, and conductive parts 12. The multiple through holes 11 are arranged in the substrate 13, and the conductive parts 12 are housed inside the through holes 11. The conductive parts 12 contain conductive particles 2, and the conductive particles 2 each comprise a substrate particle 21 and a conductive layer 22 on the surface of the substrate particle 21. The conductive layer 22 has multiple protrusions on the outer surface thereof.

A conduction test can be carried out by electrically connecting, for example, the ammeter 60 shown in FIG. 8 to the conduction inspection device member 10. The ammeter 60 may be connected, for example, to any two conductive parts 12 in the conduction inspection device member 10. Then, an electronic circuit device is connected to be in contact with the two conductive parts 12 to which the ammeter 60 is connected (in the case of the BGA substrate 50, the solder balls 51 are connected to the conductive parts 12), so that a conduction test of the electronic circuit device can be carried out.

In the conduction inspection device member 10 according to the present embodiment, the conductive parts 12 contain the conductive particles 2 each comprising the substrate particle 21 and the conductive layer 22; thus, even when compressive stress is applied to the conductive parts 12, the stress can be easily relieved. Therefore, in the conduction inspection device member 10 according to the present embodiment, cracks and voids are less likely to form in the conductive parts, conduction performance is less likely to be impaired even when a conduction test is repeated, and contact marks are less likely to remain in the portion of the member in contact with a member to be tested.

The substrate 13 is a member serving as the substrate of the conduction inspection device member 10. The substrate 13 is preferably formed of an insulating material. Examples of insulating materials include insulating resins.

The insulating resin can be, for example, a thermoplastic resin or a thermosetting resin. Examples of thermoplastic resins include polyester-based resins, polystyrene-based resins, polyethylene-based resins, polyamide-based resins, ABS resins, and polycarbonate resins. Examples of thermosetting resins include epoxy-based resins, urethane-based resins, polyimide-based resins, polyether ether ketone-based resins, polyamide imide-based resins, polyether imide-based resins, silicon-based resins, and phenol-based resins. Examples of silicon-based resins include silicone rubber.

When the substrate 13 is formed of an insulating resin, only one insulating resin may be used, or two or more insulating resins may be used.

The substrate 13 is formed in the shape of, for example, a plate, sheet, or film. The thickness of the substrate 13 can be suitably set depending on the type of conduction inspection device member 10, and can be 0.005 to 50 mm, for example. The size of the substrate 13 in plan view can also be suitably set depending on the target inspection device.

The substrate 13 can be obtained, for example, in such a manner that an insulating material, such as an insulating resin mentioned above, is used as a raw material and molded into a desired shape.

The multiple through holes 11 are arranged in the substrate 13. The through holes 11 are each formed to penetrate in the thickness direction of the substrate 13.

As shown in FIG. 1, the through hole 11 may be formed in a cylindrical shape; however, the shape is not limited thereto, and the through hole 11 may be formed in other shapes, such as a polygonal column shape. Alternatively, the through hole 11 may be formed in a tapered shape tapered in one direction, or formed in a distorted shape.

The size of the through hole 11 (e.g., the apparent area of the through hole 11 in plan view) can be a suitable size. For example, the size may be such that the conductive part can be housed and maintained. When the through hole 11 has a cylindrical shape, for example, the diameter thereof can be 0.01 to 10 mm.

The multiple through holes 11 may all have the same shape and the same size, or may be partially different.

The number of through holes 11 can also be set within a suitable range. The number of through holes 11 may be such that a conduction test is possible, and can be suitably set depending on the target inspection device. Further, the arrangement positions of the through holes 11 can also be suitably set depending on the target inspection device.

The method for forming the through holes 11 in the substrate 13 is not particularly limited. The through holes 11 can be formed by a known method.

The conductive part 12 is a member having electrical conductivity, and is housed inside the through hole 11.

Specifically, the conductive part 12 contains conductive particles 2. For example, the conductive part 12 is formed in such a manner that many conductive particles 2 are housed inside the through hole 11. That is, the conductive part 12 contains an aggregate (particle group) of the conductive particles 2.

Figure 2:
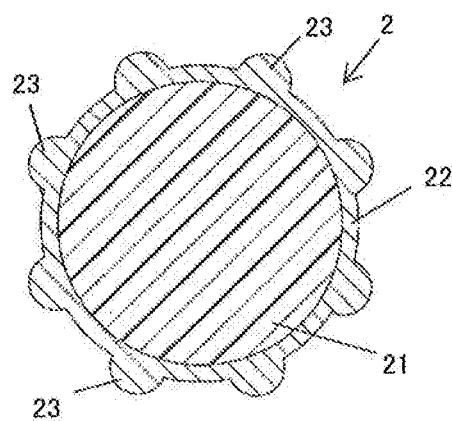
FIG. 2 is a cross-sectional view schematically showing the structure of a conductive particle used in the present invention.

FIG. 2 schematically shows a cross-sectional structure of the conductive particle 2. As shown in FIG. 2, the conductive particle 2 comprises a substrate particle 21 and a conductive layer 22 on the surface of the substrate particle 21. The conductive layer 22 has multiple protrusions 23 on the outer surface thereof. The conductive particle 2 exhibits electrical conductivity because it comprises the conductive layer 22. Further, electrical conductivity is exhibited between the particles upon contact between two or more conductive particles 2.

The type of substrate particle 21 is not particularly limited. Examples include resin particles, inorganic particles except for metal particles, organic-inorganic hybrid particles, metal particles, and the like. The substrate particles 21 are preferably resin particles, inorganic particles except for metal particles, or organic-inorganic hybrid particles.

When the substrate particles 21 are resin particles, various organic materials are suitably used as materials for forming the resin particles. Examples of such materials include polyolefin resins, such as polyethylene, polypropylene, polystyrene, silicone resin, polyvinyl chloride, polyvinylidene chloride, polyisobutylene, and polybutadiene; acrylic resins, such as polymethylmethacrylate and polymethylacrylate; polyalkylene terephthalate, polysulfone, polycarbonate, polyamide, phenol formaldehyde resin, melamine formaldehyde resin, benzoguanamine formaldehyde resin, urea formaldehyde resin, phenol resin, melamine resin, benzoguanamine resin, epoxy resin, saturated polyester resin, unsaturated polyester resin, polyphenylene oxide, polyacetal, polyimide, polyamide imide, polyether ether ketone, polyether sulfone, urea resin, and the like.

When the resin particles have flexibility, the repetition reliability of the conduction inspection device member 10 to be finally obtained is likely to be further improved.

Moreover, the resin particles can also be obtained by polymerizing one or two or more of various polymerizable monomers having an ethylenically unsaturated group. In this case, the hardness of the substrate particles 21 can be easily controlled within a suitable range. From such a viewpoint, the material of the above resin particles is preferably a polymer obtained by polymerizing one or two or more polymerizable monomers having multiple ethylenically unsaturated groups.

When the resin particles are obtained by polymerizing one or more monomers having ethylenically unsaturated groups, non-crosslinkable monomers and/or crosslinkable monomers can be used as the monomer(s) having ethylenically unsaturated groups. In the following explanations, the term "(meth)acrylic" means either "acrylic" or "methacrylic," or both, and the term "(meth)acrylate" means either "acrylate" or "methacrylate", or both.

The non-crosslinkable monomers are specifically as follows. Examples of vinyl compounds include styrene-based monomers, such as styrene, α-methylstyrene, and chlorostyrene; vinyl ethers, such as methyl vinyl ether, ethyl vinyl ether, propyl vinyl ether, 1,4-butanediol divinyl ether, cyclohexanedimethanol divinyl ether, and diethylene glycol divinyl ether; acid vinyl esters, such as vinyl acetate, vinyl butyrate, vinyl laurate, and vinyl stearate; and halogen-containing monomers, such as vinyl chloride and vinyl fluoride. Examples of (meth)acrylic compounds include alkyl (meth)acrylates, such as methyl (meth)acrylate, ethyl (meth)acrylate, propyl (meth)acrylate, butyl (meth)acrylate, 2-ethylhexyl (meth)acrylate, lauryl (meth)acrylate, cetyl (meth)acrylate, stearyl (meth)acrylate, cyclohexyl (meth)acrylate, and isobornyl (meth)acrylate; oxygen atom-containing (meth)acrylates, such as 2-hydroxyethyl (meth)acrylate, glycerol (meth)acrylate, polyoxyethylene (meth)acrylate, and glycidyl (meth)acrylate; nitrile-containing monomers, such as (meth)acrylonitrile; and halogen-containing (meth)acrylates, such as trifluoromethyl (meth)acrylate and pentafluoroethyl (meth)acrylate. Examples of α-olefin compounds include olefins, such as diisobutylene, isobutylene, Linealene, ethylene, and propylene. Examples of conjugated diene compounds include isoprene and butadiene.

The crosslinkable monomers are specifically as follows. Examples of vinyl compounds include vinyl-based monomers, such as divinylbenzene, 1,4-divinyloxybutane, and divinylsulfone. Examples of (meth)acrylic compounds include polyfunctional (meth)acrylates, such as tetramethylolmethane tetra(meth)acrylate, tetramethylolmethane tri(meth)acrylate, tetramethylolmethane di(meth)acrylate, trimethylolpropane tri(meth)acrylate, dipentaerythritol hexa(meth)acrylate, dipentaerythritol penta(meth)acrylate, glycerol tri(meth)acrylate, glycerol di(meth)acrylate, (poly)ethylene glycol di(meth)acrylate, (poly)propylene glycol di(meth)acrylate, (poly)tetramethylene glycol di(meth)acrylate, and 1,4-butanediol di(meth)acrylate. Examples of allyl compounds include triallyl (iso)cyanurate, triallyl trimellitate, diallyl phthalate, diallyl acrylamide, and diallyl ether. Examples of silicone compounds include silane alkoxides, such as tetramethoxysilane, tetraethoxysilane, triethylsilane, t-butyldimethylsilane, methyltrimethoxysilane, methyltriethoxysilane, ethyltrimethoxysilane, ethyltriethoxysilane, isopropyltrimethoxysilane, isobutyltrimethoxysilane, cyclohexyltrimethoxysilane, n-hexyltrimethoxysilane, n-octyltriethoxysilane, n-decyltrimethoxysilane, phenyltrimethoxysilane, dimethyldimethoxysilane, dimethyldiethoxysilane, diisopropyldimethoxysilane, trimethoxysilylstyrene, γ-(meth)acryloxypropyltrimethoxysilane, 1,3-divinyltetramethyldisiloxane, methylphenyldimethoxysilane, and diphenyldimethoxysilane; polymerizable double bond-containing silane alkoxides, such as vinyltrimethoxysilane, vinyltriethoxysilane, dimethoxymethylvinylsilane, dimethoxyethylvinylsilane, diethoxymethylvinylsilane, diethoxyethylvinylsilane, ethylmethyldivinylsilane, methylvinyldimethoxysilane, ethylvinyldimethoxysilane, methylvinyldiethoxysilane, ethylvinyldiethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, and 3-acryloxyprophylt-rimethoxysilane; cyclic siloxanes, such as decamethylcyclopentasiloxane; modified (reactive) silicone oils, such as one-end modified silicone oil, both-end silicone oil, and side-chain silicone oil; and carboxyl group-containing monomers, such as (meth)acrylic acid, maleic acid, and maleic anhydride.

The crosslinkable and non-crosslinkable monomers are not limited to the monomers listed above. Other polymerizable monomers, such as known polymerizable monomers, can also be used.

The above resin particles can be obtained by polymerizing one or more polymerizable monomers having ethylenically unsaturated groups mentioned above by a known method. Examples of the method include a method in which suspension polymerization is performed in the presence of a radical polymerization initiator, a method in which a monomer is swollen and polymerized together with a radical polymerization initiator using non-crosslinked seed particles ("seed polymerization method"), and the like. The conditions for these polymerization methods are not particularly limited, and known conditions can be used.

When the substrate particles 21 are inorganic particles except for metal particles, or organic-inorganic hybrid particles, examples of the inorganic material as the material of the substrate particles 21 include silica, carbon black, and the like. It is preferable that this inorganic material is not metal. The particles formed of silica are not particularly limited. Examples include particles obtained by hydrolyzing a silicon compound having two or more hydrolyzable alkoxysilyl groups to form crosslinked polymer particles, optionally followed by firing. Examples of the organic-inorganic hybrid particles include organic-inorganic hybrid particles formed of a crosslinked alkoxysilyl polymer and an acrylic resin.

When the substrate particles 21 are metal particles, examples of the metal for forming the metal particles include silver, copper, nickel, silicon, gold, titanium, etc. When the substrate particles 21 are metal particles, the metal particles are preferably copper particles. However, it is preferable that the substrate particles 21 are not metal particles.

Other examples of the material of the substrate particles 21 include resins containing polyrotaxane. Polyrotaxane refers to a structure in which a chain polymer penetrates the openings of cyclic molecules. The type of polyrotaxane is not particularly limited. For example, known polyrotaxane can be used.

When the material that constitutes the substrate particles 21 is a resin containing polyrotaxane, the polyrotaxane is preferably a crosslinked body. Specifically, in a preferable structure, the cyclic molecules in the polyrotaxane and the cyclic molecules in another polyrotaxane are crosslinked through a polymer chain. Such crosslinked polyrotaxane can increase the flexibility of the substrate particles 21; thus, a stress release effect can be easily exhibited, and the formation of cracks in the conductive parts 12 can thereby be easily suppressed. The type of such crosslinked polyrotaxane is not particularly limited. For example, known crosslinked polyrotaxane can be used.

The polyrotaxane can be produced by, for example, a known method. For example, polyrotaxane having a crosslinked structure can be produced by the reaction of a mixture of polyrotaxane having cyclic molecules having a polymerizable functional group, with a polymerizable monomer. This reaction can be performed by a known method, for example.

The type of polyrotaxane with cyclic molecules having a polymerizable functional group is not particularly limited. Specific examples include "SeRM (registered trademark) Super Polymer SM3405P," "SeRM (registered trademark) Key-Mixture SM3400C," "SeRM (registered trademark) Super Polymer SA3405P," "SeRM (registered trademark) Super Polymer SA2405P," "SeRM (registered trademark) Key-Mixture SA3400C," "SeRM (registered trademark) Key-Mixture SA2400C," "SeRM (registered trademark) Super Polymer SA3405P," and "SeRM (registered trademark) Super Polymer SA2405P," all of which are commercially available from Advanced Softmaterials Inc.

The average particle diameter of the substrate particles 21 is preferably 0.1 µm or more and 200 µm or less. In this case, the conductive particles 2 are easily housed inside the through holes 11, the conductivity of the conductive parts 12 is less likely to be impaired, and cracks and voids are less likely to form in the conductive parts 12 even when a conduction test is repeated. The average particle diameter of the substrate particles 21 is more preferably 0.5 µm or more, and particularly preferably 10 µm or more. Moreover, the average particle diameter of the substrate particles 21 is more preferably 100 µm or less, even more preferably 75 µm or less, and particularly preferably 50 µm or less.

The average particle diameter of the substrate particles 21 having a spherical shape means the diameter, and the average particle diameter of the substrate particles 21 having a shape other than a spherical shape means the average value of the maximum diameter and the minimum diameter. The average particle diameter of the substrate particles 21 means an average value obtained in such a manner that the substrate particles 21 are observed with a scanning electron microscope, and the particle diameter of 50 individual substrate particles 21 selected at random is measured by a caliper. The average particle diameter of substrate particles 21 coated with other materials (e.g., a conductive layer) as described above includes the coating layer.

The coefficient of variation (CV value) of the particle diameter of the substrate particles 21 is 50% or less, for example. The coefficient of variation (CV value) is represented by the following formula:

$$\text{CV value } (\%) = (\rho/Dn) \times 100$$

ρ: particle diameter standard deviation of the particles
Dn: average of the particle diameters of the particles In terms of further suppressing the formation of cracks and voids in the conductive parts 12, the CV value of the particle diameter of the substrate particles 21 is preferably 40% or less, and more preferably 30% or less. The lower limit of the CV value of the particle diameter of the substrate particles 21 is not particularly limited. The CV value may be 0% or more, 5% or more, 7% or more, or 10% or more.

The hardness of the substrate particles 21 is not particularly limited, and is 10 N/mm$^2$ or more and 25000 N/mm$^2$ or less, for example. In terms of further suppressing the formation of cracks and voids in the conductive parts 12, the 10% K value is preferably 100 N/mm$^2$ or more, more preferably 1000 N/mm$^2$ or more, even more preferably 10000 N/mm$^2$ or less, and particularly preferably 5000 N/mm$^2$ or less.

The 10% K value as mentioned herein refers to compressive elastic modulus when the substrate particles 21 are 10% compressed. The 10% K value can be measured in the following manner. First, using a micro-compression tester, the substrate particles 21 are compressed by the edge surface of a smooth cylindrical indenter (made of diamond; diameter: 50 µm) at 25° C. under conditions in which a maximum test load of 20 mN is applied over 60 seconds. The load value (N) and compression displacement (mm) at this time are measured. The compressive elastic modulus can be determined from the measured value using the following formula:

$$10\% \ K \text{ value } (N/mm^2) = (3/2^{1/2}) \cdot F \cdot S^{-3/2} \cdot R^{-1/2}$$

F: load value (N) when the particles are 10% compressed and deformed
S: compression displacement (m) when the particles are 10% compressed and deformed
R: radius (mm) of the particles The micro-compression tester is, for example, a "Fischer Scope H-100" (produced by Fischer). The 30% K value can be calculated by determining each of the above parameters when the particles are 30% compressed and deformed.

In the substrate particles 21, the number of aggregated particles per million particles is preferably 100 or less. In the aggregated particles, one particle is in contact with at least one other particle. For example, when 1 million substrate particles 21 include three aggregates in which three particles are aggregated, that is, each aggregate consists of three particles, the number of aggregated particles per million substrate particles 21 is nine. Examples of the method for measuring the number of aggregated particles include a method of counting the number of aggregated particles using a microscope in which the magnification is set so that about 50,000 particles are observed per visual field, and measuring the number of aggregated particles as the total of 20 visual fields.

The conductive layer 22 is present so as to coat the surface of the substrate particle 21, for example.

The conductive layer 22 is formed of a material containing metal. Examples of the metal include gold, silver, tin, copper, germanium, indium, palladium, tellurium, thallium, bismuth, zinc, arsenic, selenium, iron, lead, ruthenium, tungsten, molybdenum, aluminum, cobalt, titanium, antimony, cadmium, silicon, nickel, chromium, platinum, rhodium, and the like. Moreover, examples of the material that forms the conductive layer 22, other than metal, include graphite, alumina, titanium oxide, tungsten carbide, silicon carbide, and the like. The conductive layer 22 may comprise one or two or more of these materials. Moreover, the conductive layer 22 may be an alloy of two or more of the metals listed above.

The conductive layer 22 preferably comprises at least one member selected from the group consisting of copper, nickel, palladium, ruthenium, rhodium, silver, gold, platinum, iridium, cobalt, iron, tungsten, molybdenum, tin, germanium, indium, tellurium, thallium, bismuth, arsenic, selenium, phosphorus, boron, graphite, alumina, titanium oxide, tungsten carbide, and silicon carbide. In this case, the conductivity of the conductive parts 12 is less likely to be impaired, and cracks and voids are less likely to form in the conductive parts 12 even when a conduction test is repeated.

The conductive layer 22 may be formed in a single layer (monolayer) or in multiple layers (multilayer).

The thickness of the conductive layer 22 is preferably 0.5 nm or more, and more preferably 10 nm or more. The thickness of the conductive layer 22 is preferably 10 μm or less, more preferably 1 μm or less, even more preferably 500 nm or less, and particularly preferably 300 nm or less. When the thickness of the conductive layer 22 is equal to or more than the above lower limit and equal to or less than the above upper limit, the conductivity of the conductive parts 12 is sufficiently secured, and cracks and voids are less likely to form in the conductive parts 12 even when a conduction test is repeated. When the conductive layer 22 is a multilayer, the thickness of the conductive layer 22 refers to the sum of the thicknesses of the layers, namely the total thickness of the conductive layer 22.

The method for forming the conductive layer 22 on the surface of the substrate particles 21 is not particularly limited. Examples of the method for forming the conductive layer 22 include a method using electroless plating, a method using electroplating, a method using physical vapor deposition, and a method of coating paste containing metal powder, or metal powder and a binder, to the surface of the substrate particles 21. In terms of ease of formation of the conductive layer 22, a method using electroless plating is preferable. Examples of the method using physical vapor deposition include vacuum deposition, ion plating, and ion sputtering. When the conductive layer 22 has a multilayer structure, such a conductive layer 22 can also be formed in the same manner. For example, the above method for forming the conductive layer 22 is used to form a first conductive layer 22 on the surface of the substrate particles 21, and to further form another layer on the surface of the first layer, thereby forming a conductive layer 22 having a multilayer structure.

The hardness of the conductive particles 2 is not particularly limited. For example, the 10% K value is 10 N/mm² or more and 25000 N/mm² or less. In terms of further suppressing the formation of cracks and voids in the conductive parts 12, the 10% K value is preferably 100 N/mm² or more, and more preferably 1000 N/mm² or more; and is preferably 10000 N/mm² or less, and particularly preferably 5000 N/mm² or less.

Multiple protrusions 23 are formed on the outer surface of the conductive layer 22. The protrusion 23 is formed projecting from a base portion as the bottom to the front surface. The position in which the base portion is formed is on the surface of the conductive layer 22.

Because the multiple protrusions 23 are formed on the outer surface of the conductive layer 22, the conductive particles 2 more easily come into contact with each other. As a result, the conductivity of the conductive parts 12 is sufficiently secured, and compressive stress can be more easily relieved; thus, cracks and voids are less likely to form in the conductive parts 12 even when a conduction test is repeated.

The method for forming the protrusions 23 is not particularly limited. For example, a known method can be used. Specific examples include a method of attaching core materials to the surface of the substrate particles 21, and then forming a conductive layer 22 by electroless plating; and a method of forming a conductive layer 22 on the surface of the substrate particles 21 by electroless plating, then attaching core materials, and further forming a conductive layer 22 by electroless plating. Other examples of the method for forming the protrusions 23 include a method of forming a first conductive layer 22 on the surface of the substrate particles 21, then placing core materials on the first conductive layer 22, and subsequently forming a second conductive layer 22; and a method of adding core materials during formation of a conductive layer 22 on the surface of the substrate particles 21.

As the method for attaching core materials to the surface of the substrate particles 21, for example, core materials are added to a dispersion of the substrate particles 21, and the core materials are accumulated and attached to the surface of the substrate particles 21 due to van der Waals force, for example. In another method, core materials are added to a container in which the substrate particles 21 are placed, and the core materials are attached to the surface of the substrate particles 21 by mechanical action, such as by rotation of the container. In terms of ease of controlling the amount of the core materials to be attached, the method of accumulating and attaching the core materials to the surface of the substrate particles 21 in a dispersion is particularly preferable. When the core materials are embedded in the conductive layer 22, it is possible to easily form protrusions on the outer surface of the conductive layer 22.

Examples of the material of the core materials include conductive materials and non-conductive materials. Examples of conductive materials include metal, oxides of metal, conductive non-metal such as graphite, conductive polymers, and the like. Examples of conductive polymers include polyacetylene etc. Examples of non-conductive materials include silica, alumina, zirconia, etc. The core materials are preferably metal particles. Examples of the metal in this case include gold, silver, tin, copper, germanium, indium, palladium, tellurium, thallium, bismuth, zinc, arsenic, selenium, iron, lead, ruthenium, tungsten, molybdenum, aluminum, cobalt, titanium, antimony, cadmium, silicon, nickel, chromium, platinum, rhodium, and the like. More preferable examples include copper, nickel, palladium, ruthenium, rhodium, silver, gold, platinum, iridium, cobalt, iron, tungsten, molybdenum, tin, germanium, indium, tellurium, thallium, bismuth, arsenic, selenium, phosphorus, and boron. The metal that constitutes the protrusions 23 particularly preferably comprises one or more members selected from the group consisting of gold, silver, nickel, and copper.

The shape of the core materials is not particularly limited. The shape of the core materials is preferably a massive form. Examples of the core materials include particulate masses, aggregates of multiple fine particles, amorphous masses, etc.

The average diameter (average particle diameter) of the core materials is preferably 0.001 µm or more, and more preferably 0.05 µm or more; and is preferably 0.9 µm or less, and more preferably 0.2 µm or less. The average diameter (average particle diameter) of the core materials indicates number average diameter (number average particle diameter). The average diameter of the core materials can be determined by observing 50 randomly selected core materials with an electron microscope or an optical microscope, and calculating the average value.

When the average diameter of the core materials is measured in the conductive particle 2, for example, the average diameter of the core materials can be measured in the following manner. The conductive particles are added to a "Technovit 4000" (produced by Kulzer) to a content of 30 wt. % and dispersed therein to produce an embedding resin for testing conductive particles. A cross-section of the conductive particle is cut with an ion milling system ("IM4000," produced by Hitachi High-Technologies Corp.) so that the cross-section passes near the center of the conductive particle dispersed in the test embedding resin. Then, using a field-emission transmission electron microscope (FE-TEM) at an image magnification of 50,000×, 20 conductive particles are selected at random, and 20 protrusions of each conductive particle are observed. The diameter of the core materials in the obtained conductive particles is measured and arithmetically averaged to obtain the average diameter of the core materials.

The shape of the protrusion 23 is not particularly limited. For example, the protrusion 23 may be formed to have a spherical or elliptical cross-section, or may be formed in a needlelike shape sharpening toward the tip. For example, the shape of the protrusion can be controlled depending on, for example, the material of the core materials.

The average height of the protrusions can be 1 nm or more and 1000 nm or less. The average height is preferably 5 nm or more, and more preferably 50 nm or more; and is preferably 900 nm or less, and more preferably 500 nm or less. When the average height of the protrusions is equal to or more than the above lower limit, and equal to or less than the above upper limit, the conductive particles 2 more easily come into contact with each other.

The average height of the protrusions 23 can be measured, for example, in the following manner. The conductive particles are added to a "Technovit 4000" (produced by Kulzer) to a content of 30 wt. % and dispersed therein to produce an embedding resin for testing conductive particles. A cross-section of the conductive particle is cut with an ion milling system ("IM4000," produced by Hitachi High-Technologies Corp.) so that the cross-section passes near the center of the conductive particle dispersed in the test embedding resin. Then, using a field-emission transmission electron microscope (FE-TEM) at an image magnification of 50,000×, 20 conductive particles are selected at random, and 50 protrusions of each conductive particle are observed. The height from the base portion as the bottom of the protrusion to the top of the protrusion is regarded as the height of the protrusion, and the measured heights are arithmetically averaged to obtain the average height of the protrusions.

The average diameter of the base portions of the protrusions 23 can be 3 nm or more and 5000 nm or less. The average diameter is preferably 50 nm or more, and more preferably 80 nm or more; and is preferably 1000 nm or less, and more preferably 500 nm or less. The average diameter of the base portions is a value obtained in such a manner that the protrusions of 20 conductive particles selected at random are each observed with FE-SEM using an embedding resin by the same procedure as in the above method for measuring the average height of the protrusions 23, and the distance between both ends of each base portion is measured and arithmetically averaged.

The protrusions 23 can occupy 30% or more of 100% of the total surface area of the outer surface of the conductive layer 22. In this case, the conductive particles more easily come into contact with each other. The occupancy area of the protrusions relative to the outer surface of the conductive layer 22 can be measured, for example, in the following manner. First, an orthographic projection view of the conductive particle is photographed with a field-emission scanning electron microscope (FE-SEM). The photograph at a magnification of 6000× taken with FE-SEM is analyzed with commercially available image-analysis software. After image processing, such as planarization, the area (area in plan view) of the projected portions is determined, and the ratio of the area of the projected portions to the area of the conductive particle is regarded as the occupancy area of the protrusions. The occupancy area of the protrusions relative to the outer surface of the conductive layer 22 is determined using 20 conductive particles.

In another embodiment, the conductive particles 2 have a structure comprising substrate particles 21 having recesses, and a conductive layer 22 on the surface of the substrate particles 21 having the recesses 24. In the conductive particles 2 according to this embodiment, the conductive layer 22 may also be formed in the recesses. This is explained below while giving specific examples.

Figure 4:
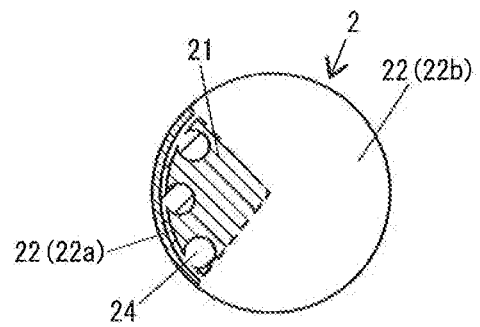
FIG. 4 is a cross-sectional view schematically showing the structure of the conductive particle according to another embodiment.

FIG. 4 shows an example of the conductive particle 2 comprising a substrate particle 21 having recesses 24, and a conductive layer 22 on the surface of the substrate particle 21 having the recesses 24, and schematically shows the appearance of the conductive particle 2. In order to show a partial cross-sectional structure of the conductive particle 2, FIG. 4 shows a broken view of a portion surrounded by a broken line.

In the conductive particle 2 according to the embodiment of FIG. 4, the multiple recesses 24 are formed on the surface of the substrate particle 21. The conductive layer 22 is placed so as to cover the surface of the substrate particle 21. In this embodiment, the conductive layer 22 is formed in a two-layer structure with a first conductive layer 22a and a second conductive layer 22b. The first conductive layer 22a is placed inside, and the second conductive layer 22b is placed outside. Specifically, the first conductive layer 22a is in contact with the surface of the substrate particle 21, and the second conductive layer 22b is present to cover the surface of the first conductive layer 22a.

The conductive layer 22 is also formed on the surface of the recess 24. In the embodiment of FIG. 4, the first conductive layer 22a is formed in the recess 24.

According to the above conductive particles 2 in which the conductive layer 22 is formed on the surface of the substrate particles 21 having the multiple recesses 24, the conductive particles 2 more easily come into contact with each other, and the effect of relieving stress applied to the conductive parts 12 increases. That is, because the conductive particles 2 have the recesses 24, the conductive particles 2 can easily follow deformation. As a result, even if stress is applied to the conductive parts 12, cracks and voids are less likely to form, the conductivity of the conductive parts 12 is less likely to be impaired, and repetition reliability is particularly improved.

The method for preparing the substrate particles 21 having the recesses 24 is not particularly limited. For example, the substrate particles 21 can be subjected to post-treatment to thereby form the recesses 24 in the substrate particles 21.

The method for forming the recesses 24 by post-treatment mentioned above is not particularly limited. For example, a known method can be used. Specific examples include a method of etching the surface of the substrate particles 21, a method of performing plasma treatment, ozone treatment, and heat-treatment in an oxygen atmosphere, a method of performing humidifying treatment, a method of performing heat-treatment under vacuum, a method of performing heat-treatment under pressure and humid conditions, a method of performing a wet process using an oxidant, and a method of performing physical treatment using a ball mill or the like.

The average depth of the recesses 24 is not particularly limited. For example, the average depth of the recesses 24 can be 0.1% or more and 80% or less of the average radius of the substrate particles 21. The depth of the recess 24 mentioned herein refers to the distance from the surface of the spherical substrate particle 21 to the bottom-most point of the recess 24 when the substrate particle 21 having the recesses 24 is regarded as a spherical shape. Specifically, the average depth is a value obtained in such a manner that the protrusions of 20 conductive particles selected at random are each observed with FE-SEM using an embedding resin by the same procedure as in the above method for measuring the average height of the protrusions, and the depth of each recess 24 is arithmetically averaged.

Figure 5:
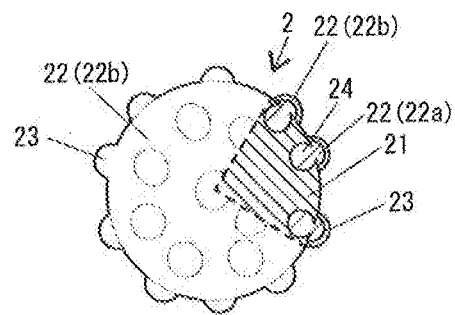
FIG. 5 is a cross-sectional view schematically showing the structure of the conductive particle according to another embodiment.

FIG. 5 shows a further modified example of the conductive particle 2, and schematically shows the appearance of this conductive particle 2. In order to show a partial cross-sectional structure of the conductive particle 2, FIG. 5 shows a broken view of a portion surrounded by a broken line.

Specifically, the conductive particle 2 of FIG. 5 comprises a substrate particle 21 having multiple recesses 24, and a conductive layer 22 on the surface of the substrate particle 21 having the multiple recesses 24. Multiple protrusions 23 are formed on the outer surface of the conductive layer 22. The conductive layer 22 is formed in a two-layer structure comprising a first conductive layer 22a and a second conductive layer 22b. That is, the conductive particle 2 according to the embodiment of FIG. 5 has both features of the conductive particles 2 shown in FIGS. 3 and 4.

According to the conductive particle 2 of the embodiment of FIG. 5, the presence of the multiple protrusions 23 facilitates contact between the conductive particles 2, and the presence of the multiple recesses 24 on the substrate particle 21 allows the conductive particles 2 to more easily follow deformation. Therefore, in the conductive parts 12 containing the conductive particles 2 of the embodiment of FIG. 5, cracks and voids are less likely to form even when a conduction test is repeated, and the conductivity of the conductive parts 12 is less likely to be impaired.

The conductive particle 2 according to the embodiment of FIG. 5 can be produced by the same method for producing the conductive particle 2 according to the embodiment of FIG. 2, except that the substrate particle 21 is replaced by a substrate particle 21 having multiple recesses 24.

The conductive part 12 may contain materials other than the conductive particles 2. For example, the conductive part 12 can contain a binder, in addition to the conductive particles 2. When the conductive part 12 contains a binder, the conductive particles 2 are more firmly aggregated, and the conductive part 12 can thereby be easily maintained in the through hole 11.

The binder is not particularly limited. Examples thereof include photocurable resins and thermosetting resins. The photocurable resins preferably include photocurable resins and photopolymerization initiators. The thermosetting resins preferably include thermosetting resins and heat-curing agents. Examples of the binder include silicone-based copolymers, vinyl resins, thermoplastic resins, curable resins, thermoplastic block copolymers, elastomers, and the like. These binders may be used singly or in combination of two or more.

The conductive part 12 is preferably densely filled in the through hole 11. In this case, a more reliable conduction test can be performed using the conduction inspection device member 10. The conductive part 12 is preferably housed in the through hole 11 to an extent that allows electrical conduction at least from the front surface of the conduction inspection device member 10 to the back surface. In the conductive part 12, the conductive particles 2 are preferably present so that they are continuously in contact with each other from the front surface of the conductive part 12 to the back surface. In this case, the conductivity of the conductive part 12 is improved.

The method for housing the conductive parts 12 in the through holes 11 is not particularly limited. For example, a conductive material containing the conductive particles 2 and a binder is filled in the through holes 11 by applying the conductive material to the substrate, followed by curing under suitable conditions, thereby forming the conductive parts 12 in the through holes 11. The conductive parts 12 are thereby housed in the through holes 11. The conductive material may contain a solvent, if necessary.

When the conductive material contains the conductive particles 2 and a binder, the amount of the binder as solids can be 5 to 99 parts by weight, and preferably 10 to 50 parts by weight, based on 100 parts by weight of the conductive particles 2.

In this manner, the conduction inspection device member 10 comprising at least the substrate 13, the through holes 11, and the conductive parts 12 can be obtained as a "probe card." The conduction inspection device member 10 may comprise other components within a range that does not impair the effects of the present invention.

Figure 6:
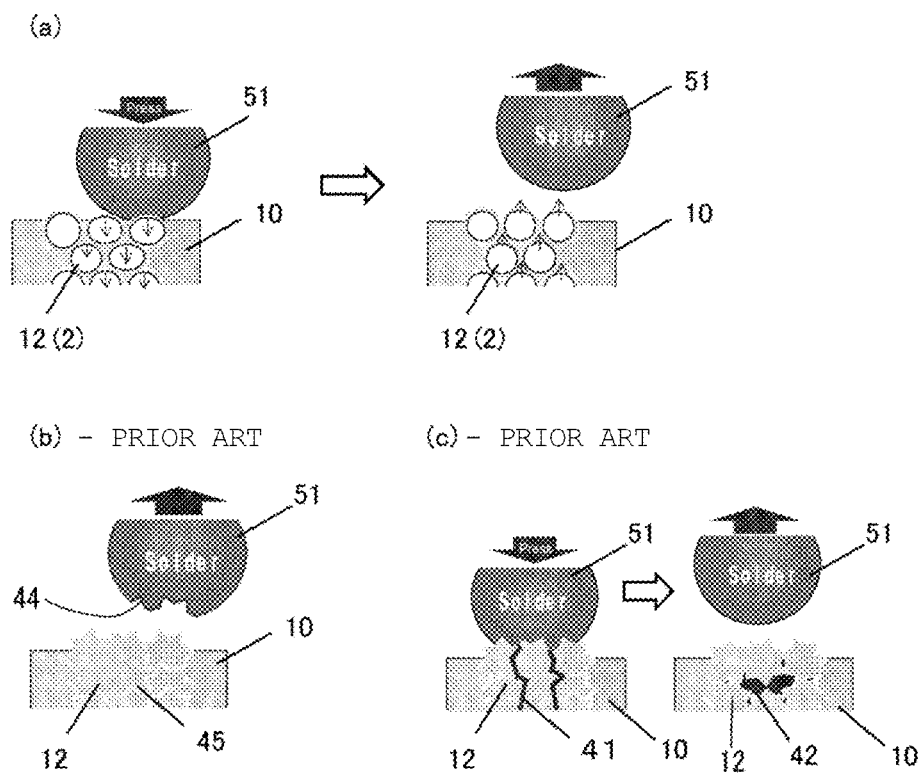
FIG. 6 shows an example of the state of a conduction test. (a) is a schematic diagram showing a conduction test using the conduction inspection device member according to the present invention, and (b) and (c) are schematic diagrams each showing a conduction test using a conventional conduction inspection device member.
Figure 7:
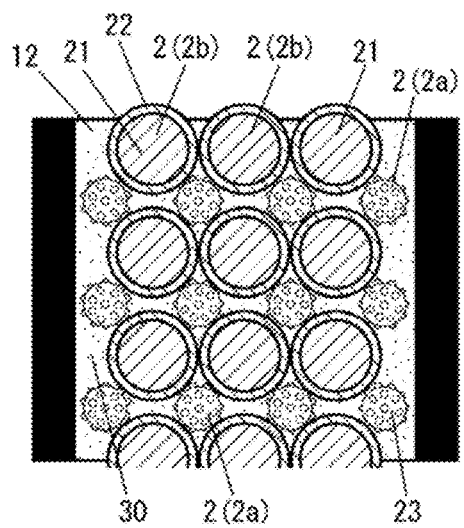
FIG. 7 schematically shows a partial cross-section of the conduction inspection device member of the present invention according to another embodiment.

FIGS. 6 and 7 are schematic diagrams each showing the state of carrying out a conduction test using the conduction inspection device member 10 having the above structure. The test subject assumed herein is a BGA substrate having a structure in which solder balls 51 are mounted (see FIG. 8).

As shown in FIG. 6 (a), in the conduction test, the solder ball 51 is brought into contact with the conductive part 12 of the conduction inspection device member 10, and compressed to test conductivity. The conductive particles 2 contained in the conductive part 12 have flexibility because they comprise the substrate particles 21 and the conductive layer 22; thus, even after the solder ball 51 applies compressive stress to the conductive part 12, almost no contact mark of the conductive part 12 remains on the solder ball 51. This is because due to the presence of the flexible conductive particles 2 in the conductive part 12, even if stress is applied, the stress is relieved. In contrast, if the conductive part 12 is formed of a conventional hard material (e.g., Ni metal powder 45), after the solder ball 51 applies compressive stress to the conductive part 12, a contact mark 44 remains on the solder ball 51, as shown in FIG. 6 (b). As a result, the circuit (BGA substrate), which is the test subject member, is damaged and the performance is reduced.

Moreover, if the conductive part 12 is formed of a hard material, cracks 41 and voids 42 are formed in the conductive part 12, as shown in FIG. 6 (c), because the solder ball 51 repeatedly applies compressive stress to the conductive part 12. As a result, the conductivity of the conductive part 12 is impaired, thereby reducing the accuracy of the conduction test or disabling the test. On the other hand, when the conductive particles 2 are contained in the conductive part 12, even after the solder ball 51 applies compressive stress to the conductive part 12, the stress is relieved, so that cracks 41 and voids 42 are less likely to form in the conductive part 12. As a result, there is lower likelihood that the conductivity of the conductive parts 12 is impaired even when the conduction test is repeated. In addition, there is almost no reduction in the accuracy of the conduction test.

FIG. 7 is a schematic diagram showing another example of the state of carrying out a conduction test using the conduction inspection device member 10 having the above structure. In this embodiment, the conductive part 12 contains two different conductive particles 2.

Specifically, in the embodiment of FIG. 7, the conductive particles 2 contained in the conductive part 12 further comprise conductive particles that do not have multiple protrusions on the outer surface of the conductive layer 22. That is, in the embodiment of FIG. 7, the conductive particles 2 contained in the conductive part 12 comprise conductive particles having multiple protrusions 23 on the outer surface of the conductive layer 22 (hereinafter referred to as "first conductive particles 2a"), and conductive particles that do not have protrusions 23 on the outer surface of the conductive layer 22 (hereinafter referred to as "second conductive particles 2b"). The conductive particles 2 of this embodiment are a mixture containing the first conductive particles 2a and the second conductive particles 2b.

In the embodiment of FIG. 7, the conductive particles 2 are placed so that they are dispersed in a cured binder 30. The first conductive particles 2a and the conductive particles 2b are also collectively referred to as "the conductive particles 2."

In the embodiment of FIG. 7, for example, the first conductive particles 2a can enter between the second conductive particles 2b so that both particles are in contact with each other. Because the first conductive particles 2a have the protrusions 23, they are more easily come into contact with the second conductive particles 2b, and contact between the conductive particles 2 further increases. This particularly improves the conductivity of the conductive parts 12, and particularly increases the stress release effect; thus, cracks 41 and voids 42 are much less likely to form, and the durability (repetition reliability) of the conduction inspection device member 10 is particularly improved.

Figure 3:
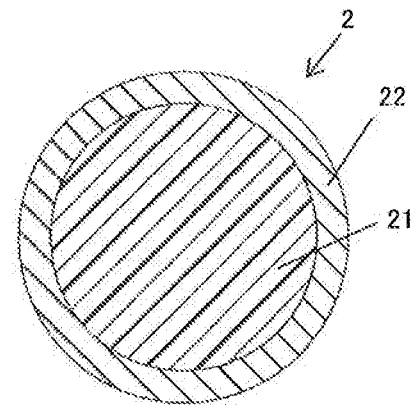
FIG. 3 is a cross-sectional view schematically showing the structure of the conductive particle.

The second conductive particles 2b have the structure shown in FIG. 3, for example. The second conductive particles 2b can have the same structure as that of the first conductive particles 2a, except that they do not have protrusions.

The conductive particles 2 contained in the conductive part 12 may be a single type, a mixture of two different types as in the embodiment of FIG. 7, or a mixture of three or more different types.

The conductive part 12 may comprise conductive materials other than the conductive particles 2. Examples of other conductive materials include a metal powder. In this case, the conductivity of the conductive part 12 is improved. Specific examples of the metal powder include powders of Ni, Cu, Au, Ag, Pd, or the like. The metal may be an alloy of two or more metals.

When the other conductive material is a metal powder, the metal powder may have a structure in which its surface is further coated with other metal. For example, the surface of the metal powder can be metal-plated to coat the surface of the metal powder with another metal.

Even when the conductive part 12 is a mixture of the conductive particles 2 and a conductive material other than the conductive particles 2, the conductivity of the conductive part 12 can be increased, and it is possible to implement a highly accurate conduction test.

Moreover, in order to further increase the conductivity of the conduction inspection device member 10, the inner surface of the through hole 11 may be metal-plated. In this case, even if the inside of the conductive part 12 is damaged due to any factor, conduction is possible due to the metal plating on the inner surface of the through hole 11; thus, the conduction test can be carried out normally.

The conduction inspection device member 10 according to the present invention can be incorporated into various conduction inspection devices. The type of conduction inspection device to which the conduction inspection device member 10 can be applied is not particularly limited. The structure of the conduction inspection device can also be the same as above, except that the conduction inspection device member 10 is incorporated.

Because the conduction inspection device comprises the conduction inspection device member 10, it can accurately perform a conduction test of electronic circuit devices, such as BGA substrates. In particular, because the conduction inspection device comprises the conduction inspection device member 10, the inspection accuracy can be maintained even when the test is repeated, and excellent durability is ensured.

EXAMPLES

The present invention is described in more detail below with reference to Examples; however, the present invention is not limited to the embodiments of these Examples.

Synthesis Example 1-1 of Conductive Particles

Ethylene glycol dimethacrylate (100 g), 800 g of isobornyl acrylate, 100 g of cyclohexyl methacrylate, and 35 g of benzoyl peroxide were mixed and uniformly dissolved to obtain a monomer mixed solution. A polyvinyl alcohol 1 wt. % aqueous solution (5 kg) was produced and placed in a reaction vessel. The monomer mixed solution prepared above was placed in the reaction vessel, and the mixture was stirred for 2 to 4 hours to thereby adjust the particle diameter so that droplets of the monomer had a predetermined particle diameter. Thereafter, the reaction was performed in a nitrogen atmosphere at 90° C. for 9 hours to obtain particles. The obtained particles were washed with hot water several times, followed by classification. The obtained polymer particles (referred to as "substrate particles S3") had an average particle diameter of 70.1 μm and a CV value of 3.1%.

After 10 parts by weight of the substrate particles S3 were dispersed in 100 parts by weight of alkali solution containing 5 wt. % of palladium catalyst solution using an ultrasonic disperser, the solution was filtered to extract the substrate particles S3. Subsequently, the substrate particles S3 were added to 100 parts by weight of dimethylamine borane 1 wt. % solution to activate the surface of the substrate particles S3. The substrate particles S3 with the activated surface were sufficiently washed with water, and then added to 500 parts by weight of distilled water and dispersed therein, thereby obtaining a suspension (A1).

The suspension (A1) was placed in a solution containing 20 g/L of copper sulfate and 30 g/L of ethylenediaminetetraacetic acid to obtain a particle mixture liquid (B1).

Further, as an electroless copper plating liquid, a copper plating liquid (C1) was prepared by adjusting the pH of a mixture containing 100 g/L of copper sulfate, 75 g/L of ethylenediaminetetraacetic acid, 50 g/L of sodium gluconate, and 50 g/L of formaldehyde to 10.5 using ammonia.

Moreover, as an electroless silver plating liquid, a silver plating liquid (D1) was prepared by adjusting the pH of a mixture containing 15 g/L of silver nitrate, 50 g/L of succinimide, and 20 g/L of formaldehyde to 8.0 using aqueous ammonia.

The copper plating liquid (C1) was gradually added dropwise to the particle mixture liquid (B1) in a dispersed state adjusted to 55° C., and electroless copper plating was performed. Electroless copper plating was performed under the following conditions: dropping rate of the copper plating liquid (C1): 30 mL/min; dropping time: 30 minutes. Thus, a particle mixture liquid (E1) containing particles having a copper conductive layer as a first conductive layer (first layer) on the surface of resin particles was obtained.

Thereafter, the particle mixture liquid (E1) was filtered to extract the particles, followed by water washing, thereby obtaining particles having a copper conductive layer on the surface of the substrate particles S3. The particles were sufficiently washed with water, then added to 500 parts by weight of distilled water and dispersed therein, thereby obtaining a particle mixture liquid (F1).

Next, the silver plating liquid (D1) was gradually added dropwise to the particle mixture liquid (F1) in a dispersed state adjusted to 60° C., and electroless silver plating was performed. Electroless silver plating was performed under the following conditions: dropping rate of the silver plating liquid (D1): 10 mL/min, and dropping time: 30 minutes. Thereafter, the particles were extracted by filtration, washed with water, and dried, thereby obtaining conductive particles having copper and silver conductive layers (thickness of the entire conductive layer: 0.1 μm) on the surface of the substrate particles S3.

Synthesis Example 1-2 of Conductive Particles

Divinylbenzene copolymer resin particles having a particle diameter of 70.0 μm ("Micro Pearl SP-270," produced by Sekisui Chemical Co., Ltd.) were prepared as the substrate particles S1.

After 10 parts by weight of the substrate particles S1 were dispersed in 100 parts by weight of alkali solution containing 5 wt. % of palladium catalyst solution using an ultrasonic disperser, the solution was filtered to extract the substrate particles S1. Subsequently, the substrate particles S1 were added to 100 parts by weight of dimethylamine borane 1 wt. % solution to activate the surface of the substrate particles S1. The substrate particles S1 with the activated surface were sufficiently washed with water, then added to 500 parts by weight of distilled water and dispersed therein, thereby obtaining a suspension (A2).

Next, 1 part by weight of metal nickel particle slurry ("2020SUS," produced by Mitsui Mining & Smelting Co., Ltd.; average particle diameter: 150 nm) was added to the suspension (A2) over 3 minutes to obtain a suspension (B2) containing the substrate particles S1 to which core materials were attached.

The suspension (B2) was placed in a solution containing 20 g/L of copper sulfate and 30 g/L of ethylenediaminetetraacetic acid to obtain a particle mixture liquid (C2).

Further, a copper plating liquid (D2), which was the same as the copper plating liquid (C1) of Synthesis Example 1-1, was prepared.

Moreover, a silver plating liquid (E2), which was the same as the silver plating liquid (D1) of Synthesis Example 1-1, was prepared.

The copper plating liquid (D2) was gradually added dropwise to the particle mixture liquid (C2) in a dispersed state adjusted to 55° C., and electroless copper plating was performed. Electroless copper plating was performed under the following conditions: dropping rate of the copper plating liquid (D2): 30 mL/min; dropping time: 30 minutes. Thus, a particle mixture liquid (F2) containing particles having a copper conductive layer as a first conductive layer (first layer) on the surface of resin particles, wherein the conductive layer had protrusions on the surface thereof, was obtained.

Thereafter, the particle mixture liquid (F2) was filtered to extract the particles, followed by water washing, thereby obtaining particles having a copper conductive layer on the surface of the substrate particles S1, wherein the conductive layer had protrusions on the surface thereof. The particles were sufficiently washed with water, then added to 500 parts by weight of distilled water and dispersed therein, thereby obtaining a particle mixture liquid (G2).

Next, the silver plating liquid (E2) was gradually added dropwise to the particle mixture liquid (G2) in a dispersed state adjusted to 60° C., and electroless silver plating was performed. Electroless silver plating was performed under the following conditions: dropping rate of the silver plating liquid (E2): 10 mL/min; dropping time: 30 minutes. Thereafter, the particles were extracted by filtration, washed with water, and dried, thereby obtaining conductive particles having copper and silver conductive layers (thickness of the entire conductive layer in the portion having no protrusions:

0.1 μm) on the surface of the substrate particles S1, wherein the conductive layer had multiple protrusions on the surface thereof.

Synthesis Example 1-3 of Conductive Particles

Divinylbenzene copolymer resin particles having a particle diameter of 35.0 μm ("Micro Pearl SP-235," produced by Sekisui Chemical Co., Ltd.) were prepared as substrate particles S2.

After 10 parts by weight of the substrate particles S2 were dispersed in 100 parts by weight of alkali solution containing 5 wt. % of palladium catalyst solution using an ultrasonic disperser, the solution was filtered to extract the substrate particles S2. Subsequently, the substrate particles S2 were added to 100 parts by weight of dimethylamine borane 1 wt. % solution to activate the surface of the substrate particles S2. The substrate particles S2 with the activated surface were sufficiently washed with water, then added to 500 parts by weight of distilled water and dispersed therein, thereby obtaining a suspension (A3).

Next, 1 part by weight of metal nickel particle slurry ("2020SUS," produced by Mitsui Mining & Smelting Co., Ltd.; average particle diameter: 150 nm) was added to the suspension (A3) over 3 minutes to obtain a suspension (B3) containing the substrate particles S2 to which core materials were attached.

The suspension (B3) was placed in a solution containing 20 g/L of copper sulfate and 30 g/L of ethylenediaminetetraacetic acid to obtain a particle mixture liquid (C3).

Further, as an electroless copper plating liquid, a copper plating liquid (D3) was prepared by adjusting the pH of a mixture containing 200 g/L of copper sulfate, 150 g/L of ethylenediaminetetraacetic acid, 100 g/L of sodium gluconate, and 50 g/L of formaldehyde to 10.5 using ammonia.

Moreover, as an electroless silver plating liquid, a silver plating liquid (E3) was prepared by adjusting the pH of a mixture containing 30 g/L of silver nitrate, 75 g/L of succinimide, and 20 g/L of formaldehyde to 8.0 using aqueous ammonia.

The copper plating liquid (D3) was gradually added dropwise to the particle mixture liquid (C3) in a dispersed state adjusted to 55° C., and electroless copper plating was performed. Electroless copper plating was performed under the following conditions: dropping rate of the copper plating liquid (D3): 20 mL/min; dropping time: 45 minutes. Thus, a particle mixture liquid (F3) containing particles having a copper conductive layer as a first conductive layer (first layer) on the surface of resin particles was obtained.

Thereafter, the particle mixture liquid (F3) was filtered to extract the particles, followed by water washing, thereby obtaining particles having a copper conductive layer on the surface of the substrate particles S1. The particles were sufficiently washed with water, then added to 500 parts by weight of distilled water and dispersed therein, thereby obtaining a particle mixture liquid (G3).

Next, the silver plating liquid (E3) was gradually added dropwise to the particle mixture liquid (G3) in a dispersed state adjusted to 60° C., and electroless silver plating was performed. Electroless silver plating was performed under the following conditions: dropping rate of the silver plating liquid (E3): 5 mL/min, and dropping time: 60 minutes. Thereafter, the particles were extracted by filtration, washed with water, and dried, thereby obtaining conductive particles having copper and silver conductive layers (thickness of the entire conductive layer in the portion having no protrusions:

0.1 Nm) on the surface of the substrate particles S2, wherein the conductive layer had multiple protrusions on the surface thereof.

Synthesis Example 1-4 of Conductive Particles

Divinylbenzene copolymer resin particles having a particle diameter of 70.0 μm ("Micro Pearl SP-270," produced by Sekisui Chemical Co., Ltd.) were prepared as the substrate particles S1.

After 10 parts by weight of the substrate particles S1 were dispersed in 100 parts by weight of alkali solution containing 5 wt. % of palladium catalyst solution using an ultrasonic disperser, the solution was filtered to extract the substrate particles S1. Subsequently, the substrate particles S1 were added to 100 parts by weight of dimethylamine borane 1 wt. % solution to activate the surface of the substrate particles S1. The substrate particles S1 with the activated surface were sufficiently washed with water, then added to 500 parts by weight of distilled water and dispersed therein, thereby obtaining a suspension (A4).

Next, 1 part by weight of metal nickel particle slurry ("2020SUS," produced by Mitsui Mining & Smelting Co., Ltd.; average particle diameter: 150 nm) was added to the suspension (A4) over 3 minutes to obtain a suspension (B4) containing the substrate particles S1 to which core materials were attached.

The suspension (B4) was placed in a solution containing 10 g/L of nickel sulfate and 10 g/L of sodium citrate to obtain a particle mixture liquid (C4).

Further, a nickel plating liquid (D4) was prepared by adjusting the pH of a mixture containing 90 g/L of nickel sulfate, 100 g/L of sodium citrate, 100 ppm of thallium nitrate, 30 ppm of bismuth nitrate, and 50 g/L of sodium hypophosphite to 6.0 using ammonia.

Moreover, a silver plating liquid (E4) was prepared by adjusting the pH of a mixture containing 15 g/L of silver nitrate, 50 g/L of succinimide, and 20 g/L of formaldehyde to 8.0 using aqueous ammonia.

The nickel plating liquid (D4) was gradually added dropwise to the particle mixture liquid (C4) in a dispersed state adjusted to 55° C., and electroless nickel plating was performed. Electroless nickel plating was performed under the following conditions: dropping rate of the nickel plating liquid (D4): 30 mL/min; dropping time: 30 minutes. Thus, a particle mixture liquid (F4) containing particles having a nickel conductive layer as a first conductive layer (first layer) on the surface of resin particles was obtained.

Thereafter, the particle mixture liquid (F4) was filtered to extract the particles, followed by water washing, thereby obtaining particles having a nickel conductive layer on the surface of the substrate particles S1. The particles were sufficiently washed with water, then added to 500 parts by weight of distilled water and dispersed therein, thereby obtaining a particle mixture liquid (G4).

Next, the silver plating liquid (E4) was gradually added dropwise to the particle mixture liquid (G4) in a dispersed state adjusted to 60° C., and electroless silver plating was performed. Electroless silver plating was performed under the following conditions: dropping rate of the silver plating liquid (E4): 10 mL/min; dropping time: 30 minutes. Thereafter, the particles were extracted by filtration, washed with water, and dried, thereby obtaining conductive particles having nickel and silver conductive layers (thickness of the entire conductive layer in the portion having no protrusions:

0.1 μm) on the surface of the substrate particles S1, wherein the conductive layer had multiple protrusions on the surface thereof.

Synthesis Example 1-5 of Conductive Particles

Divinylbenzene copolymer resin particles having a particle diameter of 70.0 μm ("Micro Pearl SP-270," produced by Sekisui Chemical Co., Ltd.) were prepared as the substrate particles S1.

After 10 parts by weight of the substrate particles S1 were dispersed in 100 parts by weight of alkali solution containing 5 wt. % of palladium catalyst solution using an ultrasonic disperser, the solution was filtered to extract the substrate particles S1. Subsequently, the substrate particles S1 were added to 100 parts by weight of dimethylamine borane 1 wt. % solution to activate the surface of the substrate particles S1. The substrate particles S1 with the activated surface were sufficiently washed with water, then added to 500 parts by weight of distilled water and dispersed therein, thereby obtaining a suspension (A5).

Next, 1 part by weight of metal nickel particle slurry ("2020SUS," produced by Mitsui Mining & Smelting Co., Ltd.; average particle diameter: 150 nm) was added to the suspension (A5) over 3 minutes to obtain a suspension (B5) containing the substrate particles S1 to which core materials were attached.

The suspension (B5) was placed in a solution containing 10 g/L of nickel sulfate and 10 g/L of sodium citrate to obtain a particle mixture liquid (C5). An electroless nickel plating liquid (D5) was prepared by adjusting the pH of a mixture containing 90 g/L of nickel sulfate, 100 g/L of sodium citrate, 100 ppm of thallium nitrate, 30 ppm of bismuth nitrate, and 50 g/L of sodium hypophosphite to 6.0 using ammonia.

An electroless gold plating liquid (E5) was prepared by adjusting the pH of a mixture containing 10 g/L of gold cyanide potassium, 20 g/L of ethylenediaminetetraacetic acid, 10 g/L of sodium citrate, and 2 g/L of dimethylamine borane to 8.0 using aqueous ammonia.

The nickel plating liquid (D5) was gradually added dropwise to the particle mixture liquid (C5) in a dispersed state adjusted to 55° C., and electroless nickel plating was performed. Electroless nickel plating was performed under the following conditions: dropping rate of the nickel plating liquid (D5): 30 mL/min; dropping time: 30 minutes. Thus, a particle mixture liquid (F5) containing particles having a nickel conductive layer as a first conductive layer (first layer) on the surface of resin particles was obtained.

Thereafter, the particle mixture liquid (F5) was filtered to extract the particles, followed by water washing, thereby obtaining particles having a nickel conductive layer on the surface of the substrate particles S1. The particles were sufficiently washed with water, then added to 500 parts by weight of distilled water and dispersed therein, thereby obtaining a particle mixture liquid (G5).

Next, the gold plating liquid (E5) was gradually added dropwise to the particle mixture liquid (G5) in a dispersed state adjusted to 45° C., and electroless gold plating was performed. Electroless gold plating was performed under the following conditions: dropping rate of the gold plating liquid (E5): 5 mL/min; dropping time: 60 minutes. Thereafter, the particles were extracted by filtration, washed with water, and dried, thereby obtaining conductive particles having nickel and gold conductive layers (thickness of the entire conductive layer in the portion having no protrusions: 0.1 μm) on the surface of the substrate particles S1, wherein the conductive layer had multiple protrusions on the surface thereof.

Synthesis Example 1-6 of Conductive Particles

Divinylbenzene copolymer resin particles having a particle diameter of 70.0 μm ("Micro Pearl SP-270," produced by Sekisui Chemical Co., Ltd.) were prepared as the substrate particles S1.

After 10 parts by weight of the substrate particles S1 were dispersed in 100 parts by weight of alkali solution containing 5 wt. % of palladium catalyst solution using an ultrasonic disperser, the solution was filtered to extract the substrate particles S1. Subsequently, the substrate particles S1 were added to 100 parts by weight of dimethylamine borane 1 wt. % solution to activate the surface of the substrate particles S1. The substrate particles S1 with the activated surface were sufficiently washed with water, then added to 500 parts by weight of distilled water and dispersed therein, thereby obtaining a suspension (A6).

Next, 1 part by weight of metal nickel particle slurry ("2020SUS," produced by Mitsui Mining & Smelting Co., Ltd.; average particle diameter: 150 nm) was added to the suspension (A6) over 3 minutes to obtain a suspension (B6) containing the substrate particles S1 to which core materials were attached.

The suspension (B6) was placed in a solution containing 10 g/L of nickel sulfate and 10 g/L of sodium citrate to obtain a particle mixture liquid (C6).

Further, a mixture containing 90 g/L of nickel sulfate, 10 g/L of cobalt sulfate, 5 g/L of ethylenediaminetetraacetic acid, 100 g/L of sodium citrate, 100 ppm of thallium nitrate, 30 ppm of bismuth nitrate, and 25 g/L of dimethylamine borane was prepared. The pH of this mixture was adjusted to 5.0 using ammonia to prepare an electroless nickel-cobalt alloy plating liquid (D6).

Moreover, as an electroless silver plating liquid, a silver plating liquid (E6) was prepared by adjusting the pH of a mixture containing 15 g/L of silver nitrate, 50 g/L of succinimide, and 20 g/L of formaldehyde to 8.0 using aqueous ammonia.

The nickel-cobalt alloy plating liquid (D6) was gradually added dropwise to the particle mixture liquid (C6) in a dispersed state adjusted to 65° C., and electroless nickel-cobalt alloy plating was performed. Electroless nickel-cobalt alloy plating was performed under the following conditions: dropping rate of the nickel-cobalt alloy plating liquid (D6): 30 mL/min; dropping time: 30 minutes. Thus, a particle mixture liquid (F6) containing particles having a nickel-cobalt alloy conductive layer as a first conductive layer (first layer) on the surface of resin particles was obtained.

Thereafter, the particle mixture liquid (F6) was filtered to extract the particles, followed by water washing, thereby obtaining particles having a nickel-cobalt alloy conductive layer on the surface of the substrate particles S1. The particles were sufficiently washed with water, then added to 500 parts by weight of distilled water and dispersed therein, thereby obtaining a particle mixture liquid (G6).

Next, the silver plating liquid (E6) was gradually added dropwise to the particle mixture liquid (G6) in a dispersed state adjusted to 60° C., and electroless silver plating was performed. Electroless silver plating was performed under the following conditions: dropping rate of the silver plating liquid (E6): 10 mL/min; dropping time: 30 minutes. Thereafter, the particles were extracted by filtration, washed with water, and dried, thereby obtaining conductive particles having nickel-cobalt alloy and silver conductive layers (thickness of the entire conductive layer in the portion having no protrusions: 0.1 μm) on the surface of the substrate particles S1, wherein the conductive layer had multiple protrusions on the surface thereof.

Synthesis Example 1-7 of Conductive Particles

Divinylbenzene copolymer resin particles having a particle diameter of 70.0 μm ("Micro Pearl SP-270," produced by Sekisui Chemical Co., Ltd.) were prepared as the substrate particles S1.

After 10 parts by weight of the substrate particles S1 were dispersed in 100 parts by weight of alkali solution containing 10 wt. % of potassium permanganate using an ultrasonic disperser, the solution was filtered to extract the substrate particles S1.

After 10 parts by weight of the substrate particles S1 were dispersed in 100 parts by weight of alkali solution containing 5 wt. % of palladium catalyst solution using an ultrasonic disperser, the solution was filtered to extract the substrate particles S1. Subsequently, the substrate particles S1 were added to 100 parts by weight of dimethylamine borane 1 wt. % solution to activate the surface of the substrate particles $1. The substrate particles S1 with the activated surface were sufficiently washed with water, then added to 500 parts by weight of distilled water and dispersed therein, thereby obtaining a suspension (A7).

Next, 1 part by weight of metal nickel particle slurry ("2020SUS," produced by Mitsui Mining & Smelting Co., Ltd.; average particle diameter: 150 nm) was added to the suspension (A7) over 3 minutes to obtain a suspension (B7) containing the substrate particles S1 to which core materials were attached.

The suspension (B7) was placed in a solution containing 20 g/L of copper sulfate and 30 g/L of ethylenediaminetetraacetic acid to obtain a particle mixture liquid (C7).

Further, as an electroless copper plating liquid, a copper plating liquid (D7) was prepared by adjusting the pH of a mixture containing 100 g/L of copper sulfate, 75 g/L of ethylenediaminetetraacetic acid, 50 g/L of sodium gluconate, and 50 g/L of formaldehyde to 10.5 using ammonia.

Moreover, as an electroless silver plating liquid, a silver plating liquid (E7) was prepared by adjusting the pH of a mixture containing 15 g/L of silver nitrate, 50 g/L of succinimide, and 20 g/L of formaldehyde to 8.0 using aqueous ammonia.

The copper plating liquid (D7) was gradually added dropwise to the particle mixture liquid (C7) in a dispersed state adjusted to 55° C., and electroless copper plating was performed. Electroless copper plating was performed under the following conditions: dropping rate of the copper plating liquid (D7): 30 mL/min; dropping time: 30 minutes. Thus, a particle mixture liquid (F7) containing particles having a copper conductive layer as a first conductive layer (first layer) on the surface of resin particles was obtained.

Thereafter, the particle mixture liquid (F7) was filtered to extract the particles, followed by water washing, thereby obtaining particles having a copper conductive layer on the surface of the substrate particles S1. The particles were sufficiently washed with water, then added to 500 parts by weight of distilled water and dispersed therein, thereby obtaining a particle mixture liquid (G7).

Next, the silver plating liquid (E7) was gradually added dropwise to the particle mixture liquid (G7) in a dispersed state adjusted to 60° C., and electroless silver plating was performed. Electroless silver plating was performed under the following conditions: dropping rate of the silver plating liquid (E7): 10 mL/min; dropping time: 30 minutes. Thereafter, the particles were extracted by filtration, washed with water, and dried, thereby obtaining conductive particles having recesses, and copper and silver conductive layers (thickness of the entire conductive layer in the portion having no protrusions: 0.1 μm) on the surface of the substrate particles S1, wherein the conductive layer had multiple protrusions on the surface thereof.

Synthesis Example 1-8 of Conductive Particles

Ethylene glycol dimethacrylate (100 g), 800 g of isobornyl acrylate, 100 g of cyclohexyl methacrylate, and 35 g of benzoyl peroxide were mixed and uniformly dissolved to obtain a monomer mixed solution. A polyvinyl alcohol 1 wt. % aqueous solution (5 kg) was produced and placed in a reaction vessel. The monomer mixed solution prepared above was placed in the reaction vessel, and the mixture was stirred for 2 to 4 hours to thereby adjust the particle diameter so that droplets of the monomer had a predetermined particle diameter. Thereafter, the reaction was performed in a nitrogen atmosphere at 90° C. for 9 hours to obtain particles. The obtained particles were washed with hot water several times, followed by classification. The obtained polymer particles (referred to as "substrate particles S3") had an average particle diameter of 70.1 μm and a CV value of 3.1%. Conductive particles were obtained in the same manner as in Synthesis Example 1-2 of Conductive Particles, except that the obtained substrate particles S3 were used in place of the substrate particles S1.

Synthesis Example 1-9 of Conductive Particles (1) Production of Silicone Oligomer 1,3-Divinyltetramethyldisiloxane (1 part by weight) and 20 parts by weight of 0.5 wt. % p-toluenesulfonic acid aqueous solution were placed in a 100-ml separable flask placed in a warm-bath tub. After stirring at 40° C. for 1 hour, 0.05 parts by weight of sodium hydrogen carbonate was added. Thereafter, 10 parts by weight of dimethoxymethylphenylsilane, 49 parts by weight of dimethyldimethoxysilane, 0.6 parts by weight of trimethylmethoxysilane, and 3.6 parts by weight of methyltrimethoxysilane were added, followed by stirring for 1 hour. Then, 1.9 parts by weight of 10 wt. % potassium hydroxide solution was added, and the mixture was heated to 85° C. While reducing the pressure with an aspirator, the mixture was stirred and reacted for 10 hours. After completion of the reaction, the pressure was returned to ordinary pressure, and the resultant was cooled to 40° C. Then 0.2 parts by weight of acetic acid was added, and the resulting mixture was allowed to stand in a separatory funnel for 12 hours or more. The lower layer after two-layer separation was extracted, and purified in an evaporator, thereby obtaining a silicone oligomer.

(2) Production of Silicone Particle Material (Containing Organic Polymer)

A solution A was prepared by dissolving 0.5 parts by weight of tert-butyl-2-ethylperoxyhexanoate (a polymerization initiator: "Perbutyl O," produced by NOF Corporation) in 30 parts by weight of the obtained silicone oligomer. Further, an aqueous solution B was prepared by mixing 150 parts by weight of ion exchange water with 0.8 parts by weight of lauryl sulfate triethanolamine salt 40 wt. % aqueous solution (an emulsifier) and 80 parts by weight of 5 wt. % aqueous solution of polyvinyl alcohol. The polyvinyl alcohol used herein had a polymerization degree of about 2000 and a saponification degree of 86.5 to 89 mol % ("Gohsenol GH-20," produced by The Nippon Synthetic Chemical Industry, Co., Ltd.). After the solution A was put in a separable flask placed in a warm-bath tub, the aqueous solution B was added. Then, emulsification was performed using a Shirasu Porous Glass (SPG) membrane (average pore diameter: about 1 μm). Thereafter, the temperature was raised to 85° C., and polymerization was performed for 9 hours. The entire quantity of particles after polymerization was washed with water by centrifugation, followed by classification. The obtained polymer particles had an average particle diameter of 70.4 μm and a CV value of 3.8%. Conductive particles were obtained in the same manner as in Synthesis Example 1-2 of Conductive Particles, except that the obtained polymer particles (referred to as "substrate particles S4") were used in place of the substrate particles S1.

Synthesis Example 1-10 of Metal Powder

Pure nickel metal particles having a particle diameter of 72.5 μm were prepared. The metal particles were added to 100 parts by weight of hydrochloric acid 10 wt. % solution to activate the surface. The particles were sufficiently washed with water, then added to 500 parts by weight of distilled water and dispersed therein, thereby obtaining a suspension (A10).

The suspension (A10) was placed in a solution containing 2 g/L of gold cyanide potassium, 10 g/L of ethylenediaminetetraacetic acid, and 10 g/L of sodium citrate to obtain a particle mixture liquid (B10).

Moreover, as an electroless gold plating liquid, a gold plating liquid (C10) was prepared by adjusting the pH of a mixture containing 20 g/L of gold cyanide potassium, 20 g/L of ethylenediaminetetraacetic acid, 10 g/L of sodium citrate, and 2 g/L of dimethylamine borane to 8.0 using aqueous ammonia.

Next, the gold plating liquid (C10) was gradually added dropwise to the particle mixture liquid (B10) in a dispersed state adjusted to 45° C., and electroless gold plating was performed. Electroless gold plating was performed under the following conditions: dropping rate of the gold plating liquid (C10): 5 mL/min; dropping time: 60 minutes. Thereafter, the particles were extracted by filtration, washed with water, and dried, thereby obtaining a pure nickel metal powder S5 having a gold-plated surface (thickness of gold plate: 0.05 μm).

Synthesis Example 1-11 of Metal Powder

Pure copper metal particles having a particle diameter of 74.2 μm were prepared. The metal particles was added to 100 parts by weight of sulfuric acid 10 wt. % solution to activate the surface. The particles were sufficiently washed with water, then added to 500 parts by weight of distilled water and dispersed therein, thereby obtaining a suspension (A11).

The suspension (A11) was placed in a solution containing 2 g/L of gold cyanide potassium, 10 g/L of ethylenediaminetetraacetic acid, and 10 g/L of sodium citrate to obtain a particle mixture liquid (B11).

Moreover, as an electroless gold plating liquid, a gold plating liquid (C11) was prepared by adjusting the pH of a mixture containing 20 g/L of gold cyanide potassium, 20 g/L of ethylenediaminetetraacetic acid, 10 g/L of sodium citrate, and 2 g/L of dimethylamine borane to 8.0 using aqueous ammonia.

Next, the gold plating liquid (C11) was gradually added dropwise to the particle mixture liquid (B11) in a dispersed state adjusted to 45° C., and electroless gold plating was performed. Electroless gold plating was performed under the following conditions: dropping rate of the gold plating liquid (C11): 5 mL/min; dropping time: 60 minutes. Thereafter, the particles were extracted by filtration, washed with water, and dried, thereby obtaining a pure copper metal powder S6 having a gold-plated surface (thickness of gold plate: 0.05 μm).

Synthesis Example 1-12 of Metal Powder

Pure silver metal particles S7 having a particle diameter of 73.1 μm were prepared.

Synthesis Example 1-13 of Metal Powder

Pure nickel metal particles S8 having a particle diameter of 72.5 μm were prepared.

Synthesis Example 1-14 of Conductive Particles

Divinylbenzene copolymer resin particles having a particle diameter of 3.0 μm ("Micro Pearl SP-203," produced by Sekisui Chemical Co., Ltd.) were prepared as substrate particles S9.

After 10 parts by weight of the substrate particles S9 were dispersed in 100 parts by weight of alkali solution containing 5 wt. % of palladium catalyst solution using an ultrasonic disperser, the solution was filtered to extract the substrate particles S9. Subsequently, the substrate particles S9 were added to 100 parts by weight of dimethylamine borane 1 wt. % solution to activate the surface of the substrate particles S9. The substrate particles S9 with the activated surface were sufficiently washed with water, then added to 500 parts by weight of distilled water and dispersed therein, thereby obtaining a suspension (A14).

Next, 1 part by weight of metal nickel particle slurry ("2020SUS," produced by Mitsui Mining & Smelting Co., Ltd.; average particle diameter: 150 nm) was added to the suspension (A14) over 3 minutes to obtain a suspension (B14) containing the substrate particles S9 to which core materials were attached.

The suspension (B14) was placed in a solution containing 20 g/L of copper sulfate and 30 g/L of ethylenediaminetetraacetic acid to obtain a particle mixture liquid (C14).

Further, a copper plating liquid (D14), which was the same as the copper plating liquid (C1) of Synthesis Example 1-1, was prepared.

Moreover, a silver plating liquid (E14), which was the same as the silver plating liquid (D1) of Synthesis Example 1-1, was prepared.

The copper plating liquid (D14) was gradually added dropwise to the particle mixture liquid (C14) in a dispersed state adjusted to 55° C., and electroless copper plating was performed. Electroless copper plating was performed under the following conditions: dropping rate of the copper plating liquid (D14): 30 mL/min; dropping time: 30 minutes. Thus, a particle mixture liquid (F14) containing particles having a copper conductive layer as a first conductive layer (first layer) on the surface of resin particles, wherein the conductive layer had protrusions on the surface thereof, was obtained.

Thereafter, the particle mixture liquid (F14) was filtered to extract the particles, followed by water washing, thereby obtaining particles having a copper conductive layer on the surface of the substrate particles S9, wherein the conductive layer had protrusions on the surface thereof. The particles were sufficiently washed with water, then added to 500 parts by weight of distilled water and dispersed therein, thereby obtaining a particle mixture liquid (G14).

Next, the silver plating liquid (E14) was gradually added dropwise to the particle mixture liquid (G14) in a dispersed state adjusted to 60° C., and electroless silver plating was performed. Electroless silver plating was performed under the following conditions: dropping rate of the silver plating liquid (E14): 10 mL/min; dropping time: 30 minutes. Thereafter, the particles were extracted by filtration, washed with water, and dried, thereby obtaining conductive particles having copper and silver conductive layers (thickness of the entire conductive layer in the portion having no protrusions: 0.1 μm) on the surface of the substrate particles S9, wherein the conductive layer had multiple protrusions on the surface thereof.

Synthesis Example 1-15 of Conductive Particles

Divinylbenzene copolymer resin particles having a particle diameter of 3.0 μm ("Micro Pearl SP-203," produced by Sekisui Chemical Co., Ltd.) were prepared as the substrate particles S9.

After 10 parts by weight of the substrate particles S9 were dispersed in 100 parts by weight of alkali solution containing 5 wt. % of palladium catalyst solution using an ultrasonic disperser, the solution was filtered to extract the substrate particles S9. Subsequently, the substrate particles S9 were added to 100 parts by weight of dimethylamine borane 1 wt. % solution to activate the surface of the substrate particles S9. The substrate particles S9 with the activated surface were sufficiently washed with water, then added to 500 parts by weight of distilled water and dispersed therein, thereby obtaining a suspension (A15).

Next, 1 part by weight of metal alumina particle slurry (average particle diameter: 150 nm) was added to the suspension (A15) over 3 minutes to obtain a suspension (B15) containing the substrate particles S9 to which core materials were attached.

The suspension (B15) was placed in a solution containing 20 g/L of copper sulfate and 30 g/L of ethylenediaminetetraacetic acid to obtain a particle mixture liquid (C15).

Further, a copper plating liquid (D15), which was the same as the copper plating liquid (C1) of Synthesis Example 1-1, was prepared.

Moreover, a silver plating liquid (E15), which was the same as the silver plating liquid (D1) of Synthesis Example 1-1, was prepared.

The copper plating liquid (D15) was gradually added dropwise to the particle mixture liquid (C15) in a dispersed state adjusted to 55° C., and electroless copper plating was performed. Electroless copper plating was performed under the following conditions: dropping rate of the copper plating liquid (D15): 30 mL/min; dropping time: 30 minutes. Thus, a particle mixture liquid (F15) containing particles having a copper conductive layer as a first conductive layer (first layer) on the surface of resin particles, wherein the conductive layer had protrusions on the surface thereof, was obtained.

Thereafter, the particle mixture liquid (F15) was filtered to extract the particles, followed by water washing, thereby obtaining particles having a copper conductive layer on the surface of the substrate particles S9, wherein the conductive layer had protrusions on the surface thereof. The particles were sufficiently washed with water, then added to 500 parts by weight of distilled water and dispersed therein, thereby obtaining a particle mixture liquid (G15).

Next, the silver plating liquid (E15) was gradually added dropwise to the particle mixture liquid (G15) in a dispersed state adjusted to 60° C., and electroless silver plating was performed. Electroless silver plating was performed under the following conditions: dropping rate of the silver plating liquid (E15): 10 mL/min; dropping time: 30 minutes. Thereafter, the particles were extracted by filtration, washed with water, and dried, thereby obtaining conductive particles having copper and silver conductive layers (thickness of the entire conductive layer in the portion having no protrusions: 0.1 μm) on the surface of the substrate particles S9, wherein the conductive layer had multiple protrusions on the surface thereof.

Example 1

A silicone-based copolymer (10 parts by weight), 90 parts by weight of the conductive particles obtained in Synthesis Example 1-2 of Conductive Particles, 1 part by weight of epoxy silane coupling agent (trade name: KBE-303, produced by Shin-Etsu Chemical Co., Ltd.), and 36 parts by weight of isopropyl alcohol were prepared. These were mixed and stirred using a homogenizing disperser at 1000 rpm for 20 minutes, followed by defoaming using a Rentaro ARE250 (produced by Thinky Corporation), thereby preparing a conductive material containing conductive particles and a binder.

The above silicone-based copolymer was polymerized in the following manner. Specifically, 162 g (628 mmol) of 4,4'-dicyclohexylmethane diisocyanate (produced by Degussa) and 900 g (90 mol) of one-ended amino group-modified polydimethylsiloxane (trade name: TSF4709, produced by Momentive) (molecular weight: 10000) were prepared. These were supplied in a 2-L metal kneader and dissolved at 70 to 90° C., followed by stirring for 2 hours. Thereafter, 65 g (625 mmol) of neopentyl glycol (produced by Mitsubishi Gas Chemical Co., Inc.) was slowly added and kneaded for 30 minutes, and the unreacted neopentyl glycol was then removed under reduced pressure. The obtained silicone-based copolymer A was used after being dissolved in isopropyl alcohol to 20 wt. %. The disappearance of the isocyanate group was confirmed by the IR spectrum. The silicone content of the obtained silicone-based copolymer A was 80 wt. %, the weight average molecular weight was 25000, the SP value was 7.8, and the SP value of the repeating unit comprising a structure having a polar group (polyurethane) was 10.

Next, silicone rubber was prepared as a sheet-like substrate comprising an insulating material of a conduction inspection device member. The size of the silicone rubber was 25 mm in width, 25 mm in length, and 1 mm in thickness. A total of 400 cylindrical through holes (20 holes in each vertical row and 20 holes in each horizontal row; diameter: 0.5 mm) were formed in the silicone rubber by laser processing.

The above conductive material was applied to the silicone rubber, which had the cylindrical through holes, using a knife coater so that the through holes were filled with the conductive material. Next, the silicone rubber in which the through holes were filled with the conductive material was dried in an oven at 50° C. for 10 minutes, and further dried at 100° C. for 20 minutes, thereby obtaining a conduction inspection device member having a thickness of 1 mm.

Example 2

A conduction inspection device member was obtained in the same manner as in Example 1, except that the conductive particles were changed to 60 parts by weight of the conductive particles obtained in Synthesis Example 1-3 in the preparation of the conductive material.

Example 3

A conduction inspection device member was obtained in the same manner as in Example 1, except that the conductive particles were changed to 90 parts by weight of the conductive particles obtained in Synthesis Example 1-4 in the preparation of the conductive material.

Example 4

A conduction inspection device member was obtained in the same manner as in Example 1, except that the conductive particles were changed to 90 parts by weight of the conductive particles obtained in Synthesis Example 1-5 in the preparation of the conductive material.

Example 5

A conduction inspection device member was obtained in the same manner as in Example 1, except that the conductive particles were changed to 90 parts by weight of the conductive particles obtained in Synthesis Example 1-6 in the preparation of the conductive material.

Example 6

A conduction inspection device member was obtained in the same manner as in Example 1, except that the conductive particles were changed to 90 parts by weight of the conductive particles obtained in Synthesis Example 1-7 in the preparation of the conductive material.

Example 7

A conduction inspection device member was obtained in the same manner as in Example 1, except that the conductive particles were changed to 90 parts by weight of the conductive particles obtained in Synthesis Example 1-8 in the preparation of the conductive material.

Example 8

A conduction inspection device member was obtained in the same manner as in Example 1, except that the conductive particles were changed to 90 parts by weight of the conductive particles obtained in Synthesis Example 1-9 in the preparation of the conductive material.

Example 9

A conduction inspection device member was obtained in the same manner as in Example 1, except that the conductive particles were changed to a mixture of 20 parts by weight of the conductive particles obtained in Synthesis Example 1-3 and 70 parts by weight of the conductive particles obtained in Synthesis Example 1-1 in the preparation of the conductive material.

Example 10

A conduction inspection device member was obtained in the same manner as in Example 1, except that the conductive particles were changed to a mixture of 40 parts by weight of the conductive particles obtained in Synthesis Example 1-2 and 50 parts by weight of the metal powder obtained in Synthesis Example 1-10 in the preparation of the conductive material.

Example 11

A conduction inspection device member was obtained in the same manner as in Example 1, except that the conductive particles were changed to a mixture of 40 parts by weight of the conductive particles obtained in Synthesis Example 1-2 and 50 parts by weight of the metal powder obtained in Synthesis Example 1-11 in the preparation of the conductive material.

Example 12

A conduction inspection device member was obtained in the same manner as in Example 1, except that the conductive particles were changed to a mixture of 40 parts by weight of the conductive particles obtained in Synthesis Example 1-2 and 50 parts by weight of the metal powder obtained in Synthesis Example 1-12 in the preparation of the conductive material.

Example 13

A conduction inspection device member was obtained in the same manner as in Example 1, except that the conductive particles were changed to 70 parts by weight of the conductive particles obtained in Synthesis Example 1-14 in the preparation of the conductive material.

Example 14

A conduction inspection device member was obtained in the same manner as in Example 1, except that the conductive particles were changed to 70 parts by weight of the conductive particles obtained in Synthesis Example 1-15 in the preparation of the conductive material.

Comparative Example 1

A conduction inspection device member was obtained in the same manner as in Example 1, except that the conductive particles were changed to 90 parts by weight of the metal powder obtained in Synthesis Example 1-10 in the preparation of the conductive material (i.e., no conductive particles were used).

Comparative Example 2

A conduction inspection device member was obtained in the same manner as in Example 1, except that the conductive particles were changed to 90 parts by weight of the metal powder obtained in Synthesis Example 1-13 in the preparation of the conductive material (i.e., no conductive particles were used).

TABLE 1

| | Type of conductive particle | | Type of protrusion of conductive particle | | | | | | 10% K value of conductive particle (N/mm²) | Initial characteristics | | | Repetition reliability test | |
|---|---|---|---|---|---|---|---|---|---|---|---|---|---|---|
| | Type of substrate particle | Conductive part | Type of metal power | Presence of protrusion | Average height of protrusion (nm) | Average diameter of protrusion base portion (nm) | Presence of recess on substrate particle surface | Particle diameter of conductive particle (μm) | | Contact resistance value | Surface state of solder ball | Contact resistance value | Cross-sectional appearance of conductive part |
| Reference Example 1 | S3 | Copper/silver laminate plating | — | None | — | — | None | 70.2 | 2250 | ○ | A | ○○ | A |
| Example 1 | S1 | Copper/silver laminate plating | — | Present | 540 | 220 | None | 71.2 | 3550 | ○○ | A | ○ | A |
| Example 2 | S2 | Copper/silver laminate plating | — | Present | 525 | 215 | None | 36.2 | 3950 | ○○ | A | ○ | A |
| Example 3 | S1 | Nickel/silver laminate plating | — | Present | 540 | 220 | None | 70.2 | 4100 | ○ | A | ○ | A |
| Example 4 | S1 | Nickel/gold laminate plating | — | Present | 540 | 220 | None | 70.2 | 4100 | ○ | A | ○ | A |
| Example 5 | S1 | Nickel/cobalt alloy/silver laminate plating | — | Present | 540 | 220 | None | 70.2 | 4300 | ○ | A | ○ | A |
| Example 6 | S1 | Copper/silver laminate plating | — | Present | 540 | 220 | Present | 70.2 | 3550 | ○ | A | ○○ | A |
| Example 7 | S3 | Copper/silver laminate plating | — | Present | 540 | 220 | None | 70.2 | 2250 | ○ | A | ○○ | A |
| Example 8 | S4 | Copper/silver laminate plating | — | Present | 540 | 220 | None | 70.2 | 1850 | ○ | A | ○○ | A |
| Example 9 | S2 | Copper/silver laminate plating | — | Present | 525 | 215 | None | 36.2 | 3950 | ○○ | A | ○○ | A |
| Example 10 | S3 | Copper/silver laminate plating | — | None | — | — | None | 70.2 | 2250 | ○○ | A | ○ | A |
| Example 11 | S1 | Copper/silver laminate plating | S5 | Present | 540 | 220 | None | 70.2 | 3700 | ○ | A | ○ | A |
| Example 12 | S1 | Copper/silver laminate plating | S6 | Present | 540 | 220 | None | 70.2 | 3700 | ○○ | A | ○ | A |
| Example 13 | S1 | Copper/silver laminate plating | S7 | Present | 540 | 220 | None | 70.2 | 3700 | ○○ | A | ○○ | A |
| Example 14 | S9 | Copper/silver laminate plating | — | Present | 550 | 230 | None | 3.0 | 3900 | ○○ | A | ○○ | A |
| Comparative Example 1 | S9 | Copper/silver laminate plating | — | Present | 550 | 230 | None | 3.0 | 3900 | ○○ | A | ○○ | A |
| Comparative Example 1 | — | — | S5 | — | — | — | — | — | — | × | B | × | B |
| Comparative Example 2 | — | — | S8 | — | — | — | — | — | — | × | B | × | B |

Table 1 shows the structures and evaluation results of the conduction inspection device members obtained in the Examples and Comparative Examples. As the structures of the conduction inspection device members, Table 1 shows the type of substrate particle in the conductive particle, the structure of the conductive part, the type of metal powder when used in combination, the structure of the protrusions of the conductive particle, the presence of recesses, and the average particle diameter and 10% K value of the conductive particles. As the evaluation of the conduction inspection device members, Table 1 shows the initial characteristics and the results of the repeat reliability test. In Table 1, "Contact resistance value" in the "Initial characteristics" column refers to the evaluation results of evaluation method (5), described later, and "Surface state of solder ball" in the "Initial characteristics" column refers to the evaluation results of evaluation method (8), described later. Further, in Table 1, "Contact resistance value" in the "Repetition reliability test" column refers to the evaluation results of evaluation method (6), described later, and "Cross-sectional appearance of conductive part" in the "Repetition reliability test" column refers to the evaluation results of evaluation method (7), described later.

Table 1 reveals that in the conduction inspection device members in which the conductive parts contain conductive particles, cracks and voids are less likely to form in the conductive parts, conduction performance is less likely to be impaired even when a conduction test is repeated, and contact marks are less likely to remain in the portion of the member in contact with a member to be tested. In particular, it is revealed that repetition reliability is further improved when conductive particles having recesses are contained (Example 6) and when a mixture of conductive particles having protrusions and conductive particles not having protrusions is contained (Example 9).

Evaluation Method (1) Measurement of Protrusion Height

The obtained conductive particles were added to "Technovit 4000" (produced by Kulzer) to a content of 30 wt. % and dispersed therein to produce an embedding resin for testing conductive particles. A cross-section of the conductive particle was cut with an ion milling system ("IM4000," produced by Hitachi High-Technologies Corp.) so that the cross-section passed near the center of the conductive particle dispersed in the test embedding resin.

Then, using a field-emission transmission electron microscope (FE-TEM) ("JEM-ARM 200F," produced by JEOL Co., Ltd.) at an image magnification of 50,000×, 20 conductive particles were selected at random, and the protrusions of each conductive particle were observed. The height of the protrusions in the obtained conductive particles was measured, and arithmetically averaged to obtain the average height of the protrusions.

(2) Measurement of Average Diameter of Protrusion Base Portion

The obtained conductive particles were added to "Technovit 4000" (produced by Kulzer) to a content of 30 wt. % and dispersed therein to produce an embedding resin for testing conductive particles. A cross-section of the conductive particle was cut with an ion milling system ("IM4000," produced by Hitachi High-Technologies Corp.) so that the cross-section passed near the center of the conductive particle dispersed in the test embedding resin.

Then, using a field-emission transmission electron microscope (FE-TEM) ("JEM-ARM 200F," produced by JEOL Co., Ltd.) at an image magnification of 50,000×, 20 conductive particles were selected at random, and the protrusions of each conductive particle were observed. The base portion diameter of the protrusions in the obtained conductive particles was measured, and arithmetically averaged to obtain the average diameter of the protrusion base portions.

(3) Measurement of Thickness of Entire Conductive Layer in Portion Having No Protrusions The obtained conductive particles were added to "Technovit 4000" (produced by Kulzer) to a content of 30 wt. % and dispersed therein to produce an embedding resin for testing conductive particles. A cross-section of the conductive particle was cut with an ion milling system ("IM4000," produced by Hitachi High-Technologies Corp.) so that the cross-section passed near the center of the conductive particle dispersed in the test embedding resin.

Then, using a field-emission transmission electron microscope (FE-TEM) ("JEM-ARM 200F," produced by JEOL Co., Ltd.) at an image magnification of 50,000×, 20 conductive particles were selected at random, and the conductive layer in the portion of each conductive particle having no protrusions was observed. The thickness of the entire conductive layer in the portion having no protrusions in the obtained conductive particles was measured, and arithmetically averaged to obtain the thickness of the entire conductive layer in the portion having no protrusions.

(4) Compressive Elasticity Modulus of Conductive Particles (10% K Value)

The compressive elasticity modulus (10% K value) of the obtained conductive particles was measured at 23° C. using a micro-compression tester ("Fischer Scope H-100," produced by Fischer) to obtain a 10% K value.

(5) Measurement of Contact Resistance of Conduction Inspection Device Member

The contact resistance values of the obtained conduction inspection device members were measured using a contact resistance measurement system (MS7500, produced by Fact K). The contact resistance was measured by pressurizing the conductive part of the obtained conduction inspection device member from the vertical direction using a platinum probe (diameter: 0.5 nm) at a load of 15 gf. In this case, 5 V was applied with a low-resistance meter (MODEL 3566, produced by Tsuruga Electric Corporation), and contact resistance values were measured. Five conductive parts selected at random were measured in this manner, and the average contact resistance value was calculated and evaluated under the following criteria.

Evaluation Criteria for Contact Resistance Value

⊙α: The average contact resistance was 50.0 mΩ or less.

○: The average contact resistance was more than 50.0 mΩ and 100.0 mΩ or less.

Δ: The average contact resistance was more than 100.0 mΩ and 500.0 mΩ or less.

x: The average connection resistance was more than 500.0 mΩ.

(6) Repetition Reliability Test of Conduction Inspection Device Member

A repetition reliability test and measurement of the contact resistance values of the obtained conduction inspection device members were carried out using a contact resistance measurement system (MS7500, produced by Fact K). The repetition reliability test was performed by repeatedly pressurizing (50000 times) the conductive part of the obtained probe sheet from the vertical direction using a platinum probe (diameter: 0.5 mm) at a load of 15 gf. After pressurization was repeated 50000 times, 5 V was applied with a low-resistance meter (MODEL 3566, produced by Tsuruga Electric Corporation), and contact resistance values were measured. Five conductive parts selected at random were measured in this manner, and the average contact resistance value was calculated and evaluated under the following criteria.

Evaluation Criteria for Contact Resistance Value after Repeated Pressurization

◯◯: The average contact resistance was 100.0 mΩ or less.
◯: The average contact resistance was more than 100.0 mΩ and 500.0 mΩ or less.
Δ: The average contact resistance was more than 500.0 mΩ and 1000.0 mΩ or less.
x: The average contact resistance was more than 1000.0 mΩ.

(7) Cross-Sectional Appearance of Conduction Inspection Device Member after Repetition Reliability Test A repetition reliability test of the obtained conduction inspection device members was carried out using a contact resistance measurement system (MS7500, produced by Fact K). The repetition reliability test was performed by repeatedly pressurizing (50000 times) the conductive part of the obtained probe sheet from the vertical direction using a platinum probe (diameter: 0.5 mm) at a load of 15 gf.

The conduction inspection device member after the repetition reliability test was fixed to "Technovit 4000" (produced by Kulzer) to produce a test embedding resin. A cross-section of the conductive part of the conduction inspection device member was cut with an ion milling system ("IM4000," produced by Hitachi High-Technologies Corp.) so that the cross-section passed near the center of the conductive part of the conduction inspection device member fixed to the test embedding resin. Ten conductive parts were observed at random using an optical microscope, and evaluated under the following criteria.

Evaluation Criteria for Cross-Section State of Conductive Part after Repetition Test A: No cracks were formed between the conductive particles or metal particles, and the binder.
B: Cracks were formed between the conductive particles or metal particles, and the binder.

(8) Appearance of Solder Ball Surface after Contact Between Solder Ball and BGA Substrate A BGA substrate mounted with solder balls (diameter: 100 μm) having an alloy composition of Sn-3.0 Ag-0.5 Cu (produced by Senju Metal Industry) was prepared. The BGA substrate was positioned so that the solder balls of the BGA substrate were placed on the conductive parts of the conduction inspection device members obtained in the Examples and Comparative Examples. Subsequently, a pressurizing head was placed on the upper surface of the BGA substrate, and allowed to come into contact by applying pressure at a load of 15 gf. Thereafter, regarding the solder ball surface after contact with the conductive part of the conduction inspection device member, 20 solder balls were observed at random with an optical microscope, and evaluated under the following criteria.

Evaluation Criteria for Solder Ball Surface State of Contact Portion

A: No contact marks were formed on the solder ball surface.
B: Contact marks were formed on the solder ball surface.

REFERENCE SIGNS LIST

10: Conduction inspection device member
11: Through hole
12: Conductive part
13: Substrate
2: Conductive particle
21: Substrate particle
22: Conductive layer
23: Protrusion
2a: First conductive particle
2b: Second conductive particle

The invention claimed is:

1. A conduction inspection device member comprising a substrate, through holes, and conductive parts;
   the through holes being arranged in the substrate,
   the conductive parts being housed inside the through holes,
   the conductive parts containing conductive particles and a binder, wherein the binder comprises a thermosetting resin and a heat-curing agent,
   the conductive particles each comprising a substrate particle and a conductive layer on a surface of the substrate particle,
   the conductive layer having multiple protrusions on an outer surface thereof.

2. The conduction inspection device member according to claim 1, wherein the conductive particles contained in the conductive parts further comprise conductive particles having no multiple protrusions on the outer surface of the conductive layer.

3. The conduction inspection device member according to claim 2, wherein the conductive layer comprises at least one member selected from the group consisting of copper, nickel, palladium, ruthenium, rhodium, silver, gold, platinum, iridium, cobalt, iron, tungsten, molybdenum, tin, germanium, indium, tellurium, thallium, bismuth, arsenic, selenium, phosphorus, boron, graphite, alumina, titanium oxide, tungsten carbide, and silicon carbide.

4. A conduction inspection device comprising the conduction inspection device member according to claim 3.

5. A conduction inspection device comprising the conduction inspection device member according to claim 2.

6. The conduction inspection device member according to claim 1, wherein the conductive layer comprises at least one member selected from the group consisting of copper, nickel, palladium, ruthenium, rhodium, silver, gold, platinum, iridium, cobalt, iron, tungsten, molybdenum, tin, germanium, indium, tellurium, thallium, bismuth, arsenic, selenium, phosphorus, boron, graphite, alumina, titanium oxide, tungsten carbide, and silicon carbide.

7. A conduction inspection device comprising the conduction inspection device member according to claim 6.

8. A conduction inspection device comprising the conduction inspection device member according to claim 1.

9. The conduction inspection device member according to claim 1, wherein the binder comprises at least one selected from the group consisting of silicone-based copolymers, vinyl resins, thermoplastic resins, curable resins, thermoplastic block copolymers, and elastomers.

10. The conduction inspection device member according to claim 1, wherein the binder comprises solids in an amount of 5 to 99 parts by weight based on 100 parts by weight of the conductive particles.

* * * * *